United States Patent
Ono et al.

(10) Patent No.: US 6,265,916 B1
(45) Date of Patent: Jul. 24, 2001

(54) CLOCK MULTIPLIER CIRCUIT CAPABLE OF GENERATING A HIGH FREQUENCY CLOCK SIGNAL FROM A LOW FREQUENCY INPUT CLOCK SIGNAL

(75) Inventors: Masayoshi Ono, Sagamihara; Yasuyuki Kimura, Maebashi, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/241,379

(22) Filed: Feb. 2, 1999

(30) Foreign Application Priority Data

Feb. 2, 1998  (JP) .................................................. 10-021269

(51) Int. Cl.$^7$ .................................................. H03B 19/00
(52) U.S. Cl. .................... 327/116; 327/119; 327/158; 327/159
(58) Field of Search ........................... 327/116, 119–122, 327/158–163

(56) References Cited

U.S. PATENT DOCUMENTS

| | | | |
|---|---|---|---|
| 5,440,259 | * | 8/1995 | Yokomura .......................... 327/160 |
| 5,535,067 | * | 7/1996 | Rooke ................................ 327/160 |
| 5,574,757 | * | 11/1996 | Ogawa ............................... 327/160 |
| 5,710,524 | * | 1/1998 | Chou et al. ........................ 327/160 |
| 5,982,208 | * | 11/1999 | Kokubo et al. ................... 327/159 |

FOREIGN PATENT DOCUMENTS 9-238072    9/1997   (JP) .

* cited by examiner

Primary Examiner—Kenneth B. Wells
(74) Attorney, Agent, or Firm—Oblon, Spivak, McClelland, Maier & Neustadt, P.C.

(57) ABSTRACT

A clock multiplier circuit comprises: a counter for counting the number of pulses of a predetermined output clock signal; an expected value generating circuit for generating an expected value for the number of pulses of the predetermined output clock signal per a first period which is sufficiently longer than one period of the predetermined output clock signal; a comparator circuit for comparing the counted value of the counter with the expected value per the first period to output a comparative information on the comparative result; a delay control circuit for generating a delay control signal indicative of change of the frequency of the predetermined output signal in accordance with the comparative information; and an output clock signal generating circuit for generating the predetermined output clock signal while changing the frequency in accordance with the delay control signal.

14 Claims, 21 Drawing Sheets

| COUNT ERROR | UPDATED ADDRESS | CORRECTION VALUE OF COUNTED ERROR |
|---|---|---|
| 1~3 | 1 | 1/2 (0 OR 1) |
| 4~63 | COUNT ERROR/2 | COUNT ERROR/4 |
| OVER 64 | 32 | 16 |

FIG.10

| NUMBER OF COMPARING OPERATION | COUNT ERROR | UPDATED ADDRESS | CORRECTION VALUE OF COUNTED ERROR |
|---|---|---|---|
| 1 | 100 | 32 | 16 |
| 2 | 84 | 32 | 16 |
| 3 | 68 | 32 | 16 |
| 4 | 52 | 26 | 13 |
| 5 | 39 | 19 | 9 |
| 6 | 30 | 15 | 8 |
| 7 | 22 | 11 | 5 |
| 8 | 17 | 8 | 4 |
| 9 | 13 | 6 | 3 |
| 10 | 10 | 5 | 3 |
| 11 | 7 | 3 | 1 |
| 12 | 6 | 3 | 2 |
| 13 | 4 | 2 | 1 |
| 14 | 3 | 1 | 0 |
| 15 | 3 | 1 | 1 |
| 16 | 2 | 1 | 0 |
| 17 | 2 | 1 | 1 |
| 18 | 1 | 1 | 0 |
| 19 | 1 | 1 | 1 |
| 20 | 0 | 0 | 0 |

FIG.11

| COUNT ERROR | UPDATED ADDRESS | CORRECTION VALUE OF COUNT ERROR |
|---|---|---|
| 1~3 | 1 | 1 |
| 4~63 | COUNT ERROR/2 | COUNT ERROR/2 |
| OVER 64 | 32 | 32 |

| NUMBER OF COMPARING OPERATION | ACCUMULATED COUNT ERROR | UPDATED ADDRESS | CORRECTION VALUE OF COUNT ERROR PER ONE TIME |
|---|---|---|---|
| 1 | 50 | -25 | -25 |
| 2 | 50+ (50-25) =75 | -32 | -32 |
| 3 | 75+ (25-32) =68 | 0 | 0 |
| 4 | 68+ (-7 ) =61 | 0 | 0 |
| 5 | 61+ (-7 ) =54 | 0 | 0 |
| 6 | 54+ (-7 ) =47 | 0 | 0 |
| 7 | 47+ (-7 ) =40 | 0 | 0 |
| 8 | 40+ (-7 ) =33 | 0 | 0 |
| 9 | 33+ (-7 ) =26 | 0 | 0 |
| 10 | 26+ (-7 ) =19 | 0 | 0 |
| 11 | 19+ (-7 ) =12 | 0 | 0 |
| 12 | 12+ (-7 ) =5 | 0 | 0 |
| 13 | 5+ (-7 ) =-2 | 0 | 0 |
| 14 | -2+ (-7 ) =-9 | 4 | 4 |
| 15 | -9+ (-7+4 ) =-12 | 6 | 6 |
| 16 | -12+ (-3+6 ) =-9 | 0 | 0 |
| 17 | -9+ (3 ) =-6 | 0 | 0 |
| 18 | -6+ (3 ) =-3 | 0 | 0 |
| 19 | -3+ (3 ) =0 | 0 | 0 |
| 20 | 0+ ( 3 ) =3 | -1 | -1 |
| 21 | 3+ ( 3 -1 ) =5 | -2 | -2 |
| 22 | 5+ ( 2 -2 ) =5 | -2 | -2 |
| 23 | 5+ ( 0 -2 ) =3 | 0 | 0 |
| 24 | 3+ (-2 ) =1 | 0 | 0 |
| 25 | 1+ (-2 ) =-1 | 0 | 0 |
| 26 | -1+ (-2 ) =-3 | 1 | 1 |
| 27 | -3+ (-2+1 ) =-4 | 2 | 2 |
| 28 | -4+ (-1+2 ) =-3 | 0 | 0 |
| 29 | -3+ (1 ) =-2 | 0 | 0 |
| 30 | -2+ (1 ) =-1 | 0 | 0 |
| 31 | -1+ (1 ) =0 | 0 | 0 |

FIG.18

| NUMBER OF COMPARING OPERATION | ACCUMULATED COUNT ERROR | UPDATED ADDRESS AMOUNT | DIFFERENCE BETWEEN CURRENT ADDRESS AND ADDRESS OF IDEAL FREQUENCY |
|---|---|---|---|
| 1 | 1 (1.5) | -1 | 0 |
| 2 | 1 (1.5-0.1= 1.4 ) | -1 | -1 |
| 3 | 1 (1.4-0.1-0.1= 1.2) | -1 | -2 |
| 4 | 0 (1.2-0.2-0.1= 0.9) | 0 | -3 |
| 5 | 0 (0.9-0.3-0= 0.6) | 0 | -3 |
| 6 | 0 (0.6-0.3-0= 0.3) | 0 | -3 |
| 7 | 0 (0.3-0.3-0= 0) | 0 | -3 |
| 8 | 0 (0-0.3-0= -0.3) | 0 | -3 |
| 9 | 0 (-0.3-0.3-0=-0.6) | 0 | -3 |
| 10 | 0 (-0.6-0.3-0=-0.9) | 0 | -3 |
| 11 | -1 (-0.9-0.3-0=-1.2) | 1 | -3 |
| 12 | -1 (-1.2-0.3+0.1=-1.4) | 1 | -2 |
| 13 | -1 (-1.4-0.2+0.1=-1.5) | 1 | -1 |
| 14 | -1 (-1.5-0.1+0.1=-1.5) | 1 | 0 |
| 15 | -1 (-1.5-0+0.1=-1.4) | 1 | 1 |
| 16 | -1 (-1.4+0.1+0.1=-1.2) | 1 | 2 |
| 17 | 0 (-1.2+0.2+0.1=-0.9) | 0 | 3 |
| 18 | 0 (-0.9+0.3+0=-0.6) | 0 | 3 |
| 19 | 0 (-0.6+0.3+0=-0.3) | 0 | 3 |
| 20 | 0 (-0.3+0.3+0=0) | 0 | 3 |
| 21 | 0 (0+0.3+0=0.3) | 0 | 3 |
| 22 | 0 (0.3+0.3+0=0.6) | 0 | 3 |
| 23 | 0 (0.6+0.3+0=0.9) | 0 | 3 |
| 24 | 1 (0.9+0.3+0=1.2) | -1 | 3 |
| 25 | 1 (1.2+0.3-0.1=1.4) | -1 | 2 |
| 26 | 1 (1.4+0.2-0.1=1.5) | -1 | 1 |
| 27 | 1 (1.5+0.1-0.1=1.5) | -1 | 0 |

FIG.19

CLOCK MULTIPLIER CIRCUIT CAPABLE OF GENERATING A HIGH FREQUENCY CLOCK SIGNAL FROM A LOW FREQUENCY INPUT CLOCK SIGNAL

BACKGROUND OF THE INVENTION

The present invention relates generally to a clock multiplier circuit. More specifically, the invention relates to a clock multiplier circuit suitably used for generating a high frequency clock signal having small jitters from a low frequency input clock signal.

FIG. 1 is a circuit diagram showing a conventional digital phase locked loop (which will be hereinafter referred to PLL) circuit (see the Japanese Official Gazette of Patent Application Laid-Open No. 9-238072). The digital PLL circuit of FIG. 1 comprises: a 1/M divider 1 for dividing a reference clock signal by M; a frequency comparator circuit 2 for comparing the frequencies of outputs of the 1/M divider 1 and a 1N divider 7; a delay control circuit 3 for controlling a delayed value of a ring oscillator on the basis of information from the frequency comparator circuit 2; the ring oscillator 4 comprising a delay variable circuit 5 and an inverter 6, which are capable of changing the delayed value on the basis of control information from the delay control circuit 3; and the 1/N divider 7 for dividing an output clock signal of the ring oscillator by N.

The frequency comparator circuit 2 counts the numbers of pulses of two input clock signals from the 1/M divider 1 and the 1/N divider 7, by means of a counter, and compares the frequencies of the two clock signals on the basis of magnitude of the counted numbers. The delay control circuit 3 controls the delayed value of the ring oscillator 4 on the basis of information of the frequency comparator circuit 2 so that the clock frequency of the ring oscillator 4 divided by N is equal to the clock frequency obtained by dividing the frequency clock frequency by M.

However, in the conventional digital PLL circuit, there is a problem in that it is difficult to increase a multiplication factor.

For example, it is assumed that the reference clock signal has a frequency of 32 KHz, and the digital PLL output clock signal has a frequency of 32 MHz, the multiplication factor being 1000, the dividing value M of the divider 2 being 1, and the dividing value N of the divider 7 being 1000. Usually, the frequency comparator circuit 2 can not accurately compare frequencies unless a counter of at least 10 bits counts 1000. On the other hand, when the number of counted pulses of the digital PLL output clock signal is 1000, the number of counted pulses of the input clock signal to the frequency comparator circuit 2 from the 1/N divider 7 is 1. Therefore, one comparing operation can not be carried out unless the number of counted pulses of the digital PLL output clock signal is 1000000(=1000×1000).

Thus, the frequency comparison needs such a large counted value. Therefore, in the conventional circuit, which can compare frequencies only one time per about 1000000 counts, there is a problem in that the speed of response is too slow so that jitters are increased, since the frequency of the stable ring oscillator fluctuates in accordance with external voltage, temperature and so forth. In addition, in the lock-in time to lock the PLL circuit, it is required to compare frequencies at least ten times, so that it takes at least few seconds. Therefore, there is also a problem in that it is not allowable.

SUMMARY OF THE INVENTION

It is therefore an object of the present invention to eliminate the aforementioned problems and to provide a clock multiplier circuit for generating a high frequency clock signal having a large multiplication factor from a low frequency input clock, the clock multiplier circuit being capable of comparing frequencies at high speed, the clock multiplier circuit being stable and having a short lock-in time and small jitters.

In order to accomplish the aforementioned and other objects, according to a first aspect of the present invention, a clock multiplier circuit comprises: a counter for counting the number of pulses of a predetermined output clock signal; an expected value generating circuit for generating an expected value for the number of pulses of the predetermined output clock signal per a first period which is sufficiently longer than one period of the predetermined output clock signal; a comparator circuit for comparing the counted value of the counter with the expected value per the first period to output a comparative information on the comparative result; a delay control circuit for generating a delay control signal indicative of change of the frequency of the predetermined output signal in accordance with the comparative information; and an output clock signal generating circuit for generating the predetermined output clock signal while changing the frequency in accordance with the delay control signal.

With this construction, the counted value is compared with the expected value, and the period for comparison between the counted value and the expected value can be far shorter than the period for the frequency comparison in the conventional PLL circuit, so that the lock-in time can be considerably shortened. As a result, a high frequency output clock signal, which is stable and which has small jitters, can be generated at high speed.

In the clock multiplier circuit according to the first aspect of the present invention, the counter may be reset every the first period.

According to a second aspect of the present invention, a clock multiplier circuit comprises: a counter for counting the number of pulses of a predetermine output clock signal; a register for receiving and outputting a counted value of the counter every a first period which is sufficiently longer than one period of the predetermined output clock signal; an expected value generating circuit for generating an expected value for the number of pulses of the predetermined output clock signal per the first period; an accumulated expected value generating circuit for outputting an accumulated expected value, which is obtained by accumulating the expected value, every the first period; a comparator circuit for comparing the counted value outputted from the register with the accumulated expected value to output a comparative information on the comparative result; a delay control circuit for generating a delay control signal indicative of change of the frequency of the predetermined output signal in accordance with the comparative information; and an output clock signal generating circuit for generating the predetermined output clock signal while changing the frequency in accordance with the delay control signal.

With this construction, the counter continues to count up without being reset every one period for comparison in the comparator. The expected value for the counted value is accumulated to be an accumulated expected value which is twice as large as the expected value in one period for comparison when the second frequency comparison is carried out, three times as large as the expected value in one period for comparison when the third frequency comparison is carried out, and L times as large as the expected value in one period for comparison when the number L frequency comparison is carried out. Then, the counted value is compared with the accumulated expected value. Therefore, the frequency error can be very small in a period T which is sufficiently longer than one period of the input clock signal. As a result, a high frequency output clock signal, which is stable and which has small jitters, can be generated at high speed.

In the clock multiplier circuit according to the second aspect of the present invention, the counter, the register and the accumulated expected value generating circuit may be reset per a second period which is sufficiently longer than the first period.

In addition, in the clock multiplier circuit according to the first or second aspect of the present invention, the comparator circuit may be a subtracter circuit.

Moreover, the output clock signal generating circuit may comprise: a plural stages of delay generating circuits, the number of stages of the delay generating circuits to be connected in series as a signal propagating path being capable of being selectively changed in accordance with the delay control signal; and a ring oscillator comprising a delay line including a plurality of load capacities, the number of the load capacities added upstream of the plural stages of delay generating circuits being capable of being selectively changed in accordance with the delay control signal, and an inverter connected between an output node and input node of the delay line.

Moreover, the output clock signal generating circuit may comprise: a plural stages of delay generating circuits, the number of stages of the delay generating circuits to be connected in series as a signal propagating path being capable of being selectively changed in accordance with the delay control signal; and a ring oscillator comprising a delay line including a plurality of load capacities, the number of the load capacities added upstream of the plural stages of delay generating circuits being capable of being selectively changed in accordance with the delay control signal, and a NAND circuit, one input of which is connected to an output node of the delay line and the other input of which receives an enable signal, the output node of the NAND circuit being connected to an input node of the delay line.

BRIEF DESCRIPTION OF THE DRAWINGS

In the drawings:

FIG. 10 is a table showing the relationship between count errors, updated addresses and count error correction values, in a delay line design;

FIG. 11 is a table showing an example of control for converging count errors in the table of FIG. 10;

FIG. 18 is a table of an example of control for converging count errors in the table of FIG. 17;

FIG. 19 is a table showing the results when the amount of an updated address is controlled in a manner shown in FIG. 17;

DESCRIPTION OF THE PREFERRED EMBODIMENTS

Referring now to the accompanying drawings, the preferred embodiments of a clock multiplier circuit according to the present invention will be described in detail below.

Figure 1:
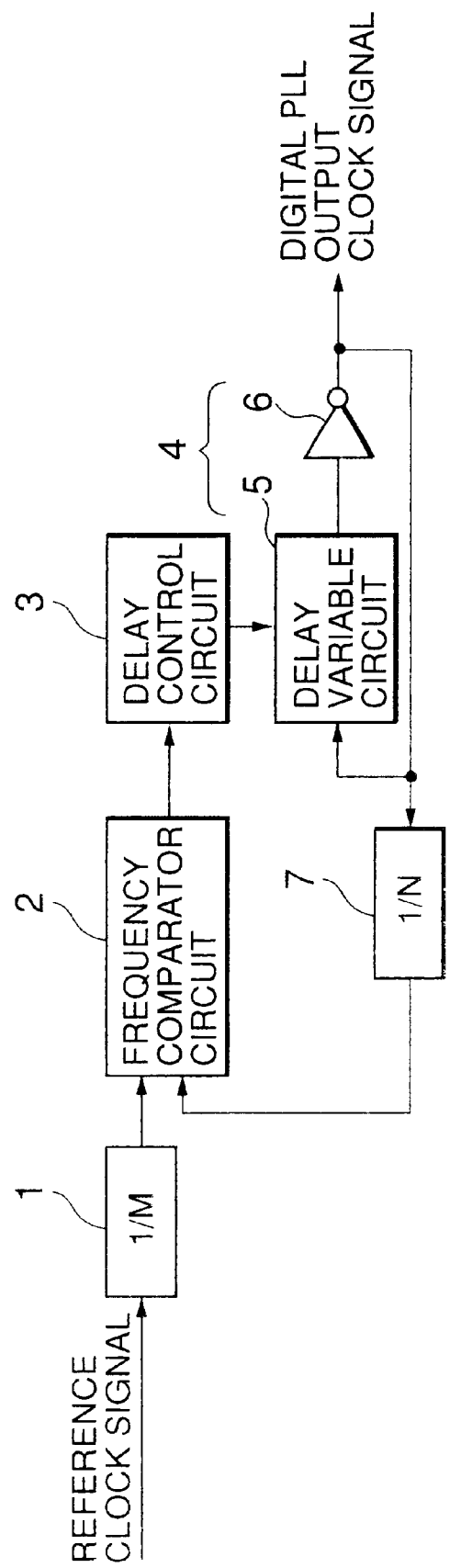
FIG. 1 is a circuit diagram showing a conventional digital PLL circuit.
Figure 2:
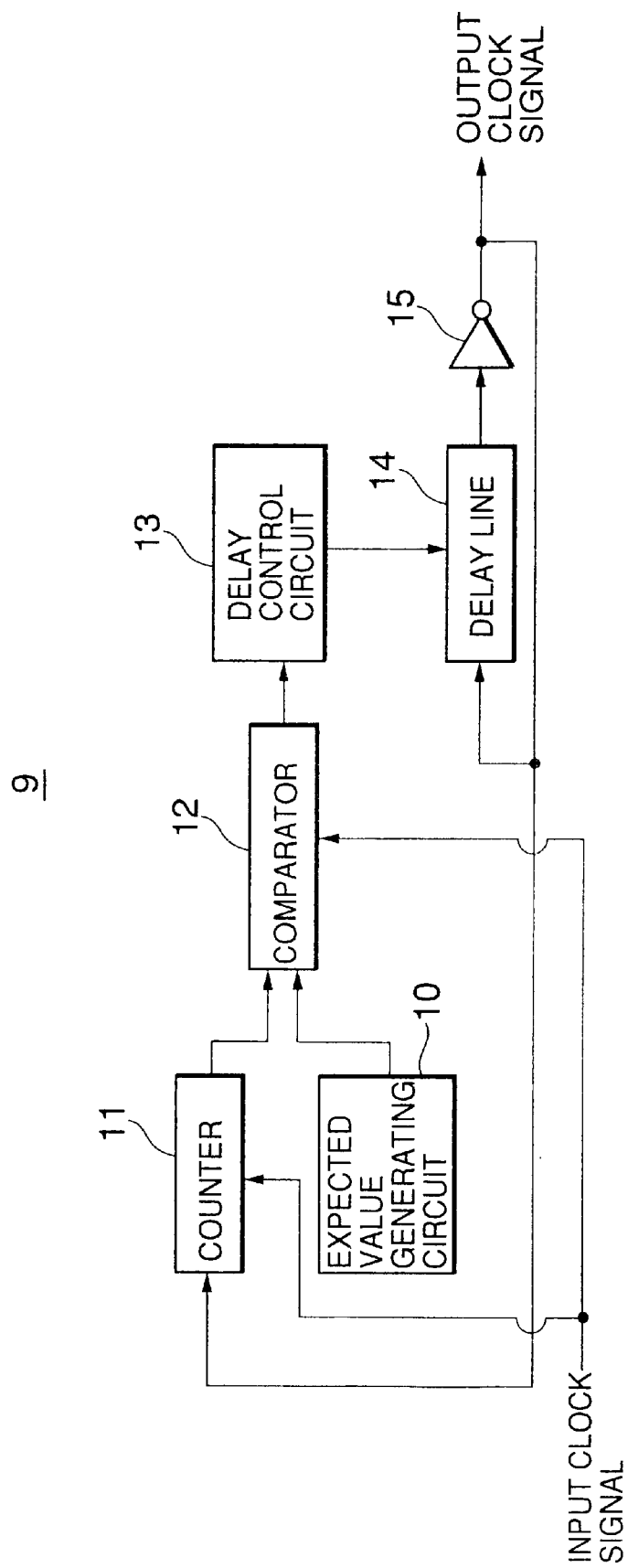
FIG. 2 is a block diagram of the first preferred embodiment of a clock multiplier circuit according to the present invention.

FIG. 2 is a block diagram of the first preferred embodiment of a clock multiplier circuit 9 according to the present invention. In the first embodiment, the clock multiplier circuit comprises: a counter 11 for counting the number of pulses of an output clock signal of a ring oscillator; an expected value generating circuit 10 for generating an expected value of the number of pulses of the output clock signal per one period of an input clock signal; a comparator 12 for comparing the counted value of the counter 11 with the expected value of the expected value generating circuit 10; a delay control circuit 13 for controlling a delayed value of the ring oscillator on the basis of information from the comparator 12; and the ring oscillator comprising a delay line 14 and an inverter 15 which are capable of changing the delayed value on the basis of a control signal for the delay control circuit 13.

The operation of the counter 11 and the comparator 12 is controlled by the input clock signal. The counter 11 counts the number of pulses of the output clock signal in one period of the input clock signal.

The expected value generating circuit 10 generates, as an expected value to be inputted to the comparator 12, a counted value when counting the number of pulses of an ideal output clock signal in one period of the input clock signal. For example, when it is intended to derive an output clock signal having a frequency of 32 MHz from an input clock signal having a frequency of 32 KHz, an expected value of (1/32K)/(1/32M)=1000 is generated as a binary data. When the frequencies of the input clock signal and the output clock signal to be derived are changed, the setting of the frequencies of the input clock signal and the output clock signal to be derived is inputted to calculated and generated the expected value. When the frequencies of the input clock signal and the output clock signal to be derived are always constant, the expected value generating circuit 10 is enough to always generate a constant expected value. Furthermore, when the expected value to be generated by the expected value generating circuit 10 can be supplied from an external signal, the circuit 10 does not need to be provided.

The comparator 12 compares the counted value of the counter with the expected value every one period of the input clock signal. When the expected value is greater than the counted value, the comparator 12 outputs a DOWN signal, and when the expected value is less than the counted value, the comparator 12 outputs an UP signal. When the expected value is equal to the counted value, both of the DOWN and UP signals are not outputted. The counter 11 is reset and carries out the next counting operation immediately after the comparison in the comparator 12.

Figure 3:
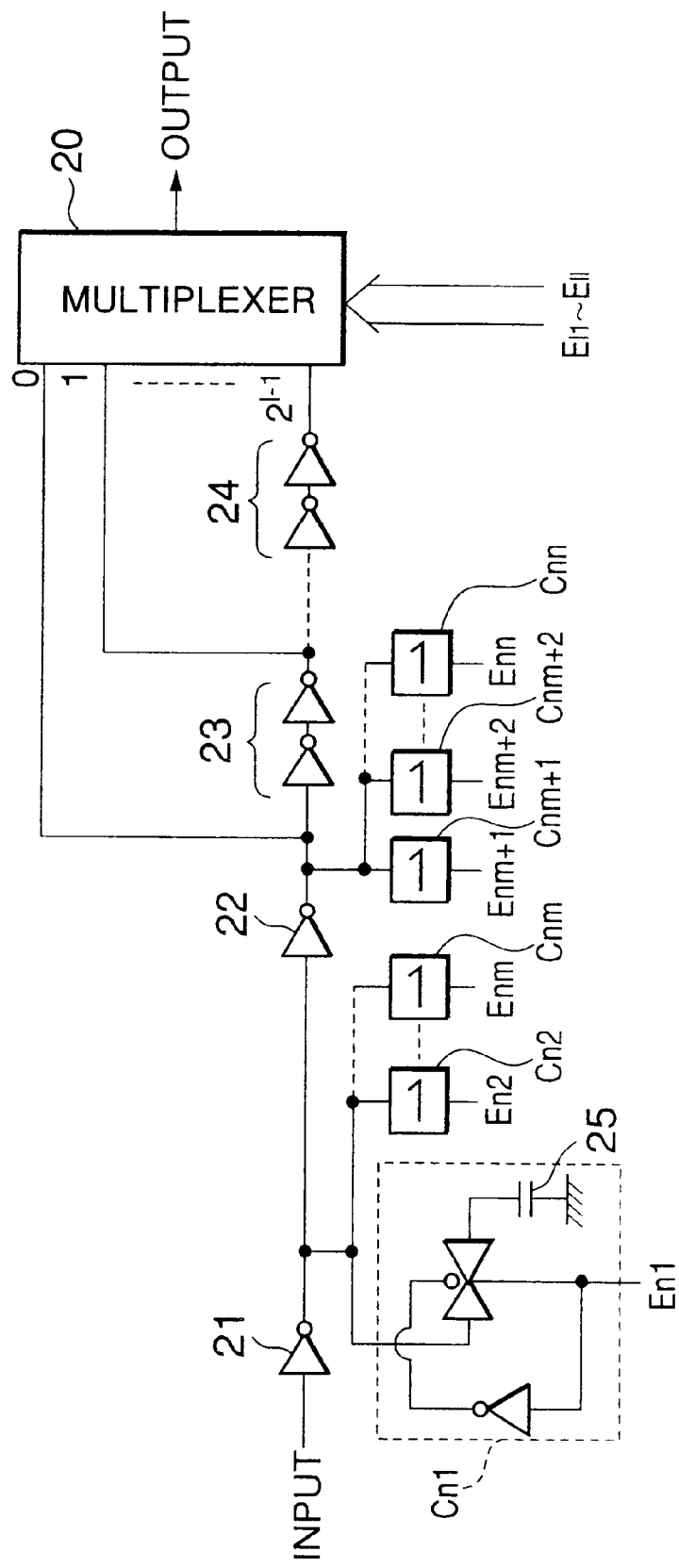
FIG. 3 is a block diagram showing an example of a delay line of a clock multiplier circuit according to the present invention.

FIG. 3 is a block diagram of an example of a delay line of a clock multiplier circuit according to the present invention. The delay line 14 of FIG. 3 comprises: first and second inverters 21, 22 connected in series; a plurality of inverters 23, . . . , 24 which are connected in series to the second inverter 22 and which are capable of switching the number of connected stages every two stages; a multiplexer 20 for switching the number of connected stages of the plurality of inverters 23, . . . , 24 every two stages; variable load capacities Cn1~Cnm which are connected to the output side of the first inverter 21 and which are capable of changing the number of the variable load capacities Cn1~Cnm to be added; and variable load capacities Cnm+1~Cnn which are connected to the output side of the second inverter 22 and which are capable of changing the number of the variable load capacities Cnm+1~Cnn to be added. Each of the load capacities Cn1~Cnn is designed to connect or disconnect the capacitor 25 to for from the first or second inverter 21, 22 by means of an analog switch.

In the delay line of FIG. 3, the delayed value can be changed in a relatively large range every two stages by changing the number of stages of the inverters to be connected in series by control signals E11~Ell inputted to the multiplexer 20. In addition, any load capacities Cn1~Cnn can be selectively connected by means of the control signal En1~Enn. That is, the number of the load capacities added to the first and second inverters 21, 22 is the number of the control signals En1~Enn of "1". Thus, by changing the number of load capacities to be added, the delayed value can be changed in a minute range of a several pico-seconds (ps) to several tens ps.

Figure 4:
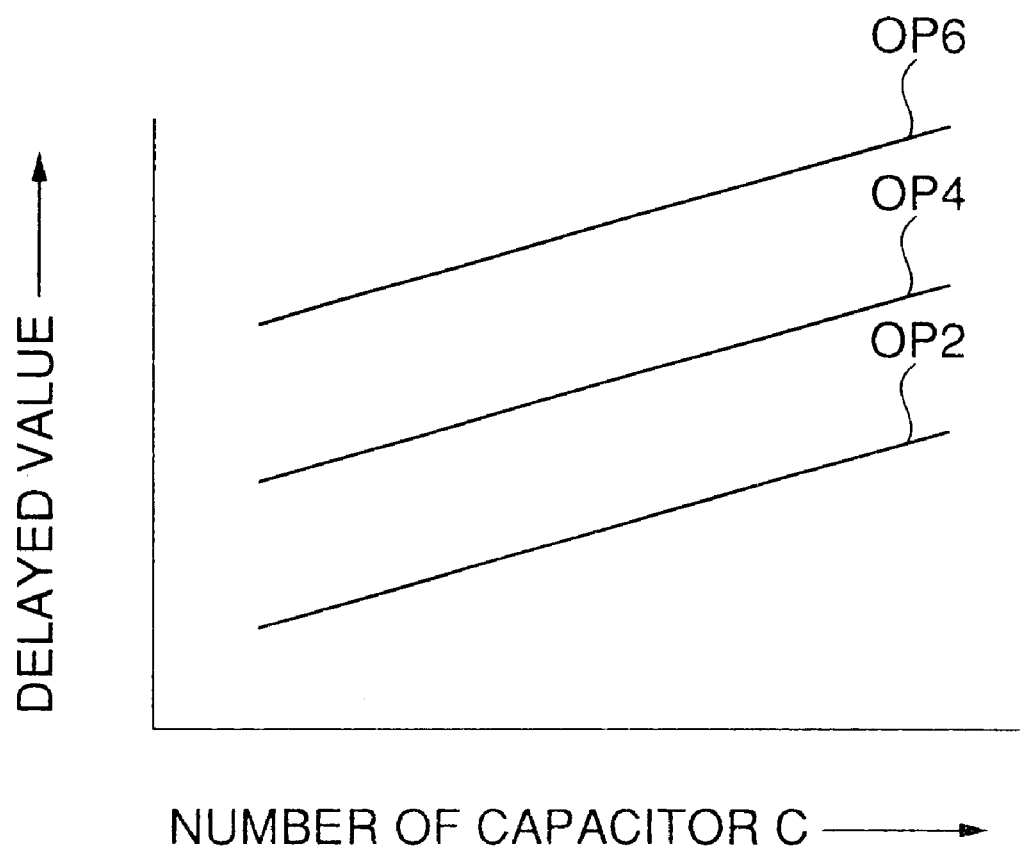
FIG. 4 is a graph showing a delay characteristic of the delay line shown in FIG. 3.

FIG. 4 is a graph showing the delay characteristics of the delay line of FIG. 3. The abscissa denotes the numbers of load capacities to be added, and the ordinate denotes delayed values. The numbers of stages to be connected in series are parameters, and OP2, OP4 and OP6 denote the delay characteristics when it is selected by means of the control signals E11~Ell that two, four and six stages of inverters are connected in series, respectively.

Figure 5:
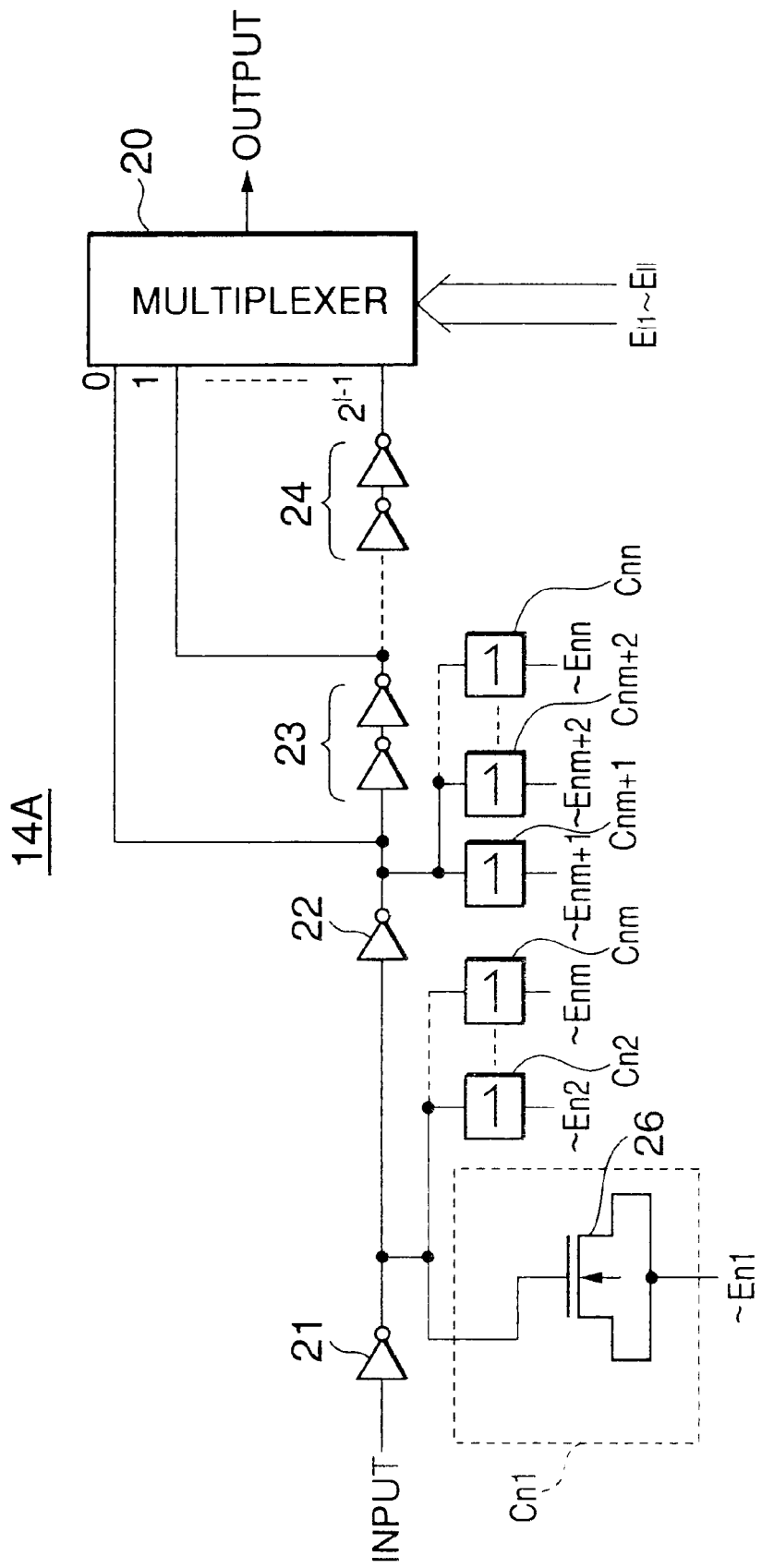
FIG. 5 is a block diagram showing another example of a delay line of a clock multiplier circuit according to the present invention.

FIG. 5 is a block diagram of another example of a delay line of a clock multiplier circuit according to the present invention. The whole construction of the delay line of FIG. 5 is the same as that of the delay line of FIG. 3, expect that each of the load capacities Cn1~Cnn comprises a transistor. The capacity loaded on the first or second inverter 21, 22 is controlled by the turning ON and OFF of the transistors comprising the load capacities Cn1~Cnn, so that the delayed value can be change din a minute range.

Furthermore, similar to the delay line of FIG. 3, the delayed value can be change din a relatively large range every two stages of inverters by selecting the number of stages of inverters connected in series on the basis of the control signals E11~Ell inputted to the multiplexer 20. Furthermore, the construction of the delay line shown in FIG. 3 or 5 is commonly used for the preferred embodiments of the present invention, which will be described later, in addition to the first preferred embodiment.

In the first preferred embodiment of a clock multiplier circuit according to the present invention shown in FIG. 2, the delay control circuit 13 outputs the delay control signals En1~Enn and E11~Ell for controlling the delay values of the delay line 14 forming the ring oscillator, in accordance with the UP or DOWN signal from the comparator 12.

As a result of the comparison between the counted value and the expected value by means of the comparator 12, when the expected value is less than the counted values, the comparator 12 outputs the UP signal. When the comparator 12 outputs the UP signal, the number of signals of "1" of the delay control signals En1~Enn is increased by 1, so that the number of load capacities added to the first or second inverter 21, 22 is increased by 1 to decrease the frequency of the output clock signal of the ring oscillator. As a result, in the comparison after the next period of the input clock signal, the counted value of the counter 11 is less than that in the last comparison.

As a result of comparison in the comparator 12, if the expected value is less than the counted value, the UP signal is further outputted to increase the number of signals of "1" of the delay control signals En1~Enn by one more. When all of the delay control signals En1~Enn are "1", the load capacities can not be further added. In that case, the addresses of the delay control signals E11~Ell are increased by 1 address so that the number of stages of inverters connected in series is increased by two stages, and all of the delay control signals En1~Enn for controlling the number of load capacities to be added are set to be "0". Such operation is repeated, sot hat the expected value is coincident with the counted value.

On the other hand, as a result of the comparison between the counted value and the expected value by means of the comparator 12, when the expected value is greater than the counted value, the comparator 12 outputs the DOWN signal. When the comparator 12 outputs the DOWN signal, the number of signals of "1" of the delay control signals En1~Enn is decreased by 1, so that the number of load capacities added to the first or second inverter 21, 22 is decreased by 1 to increase the frequency of the output clock signal of the ring oscillator. As a result, in the comparison after the next period of the input clock signal, the counter value of the counter 11 is greater than that in the last comparison.

As a result of comparison in the comparator 12, if the expected value is greater than the counted value, the DOWN signal is further outputted to decrease the number of signals of "1" of the delay control signals En1~Enn by one more.

When all of the delay control signals En1~Enn are "0", the number of the load capacities can not be further decreased. In that case, the addresses of the delay control signals E11~Ell are decreased by 1 address so that the number of stages of inverters connected in series is decreased by two stages, and all of the delay control signals En1~Enn for controlling the number of load capacities to be added are set to be "1". Such operation is repeated, so that the expected value is coincident with the counted value.

In the conventional PLL circuit, the frequency of the input clock signal is compared with the frequency of the output signal of the ring oscillator every about 1000 periods of the input clock signal, whereas in the clock multiplier circuit of the present invention, the number of pulses of the output signal of the ring oscillator is compared with the expected value of the number of pulses thereof every one period of the input clock signal. Therefore, the lock-in time can be greatly decreased to about thousandth. As a result, a high frequency output clock signal, which is stable and which has small jitters, can be generated at high speed.

Figure 6:
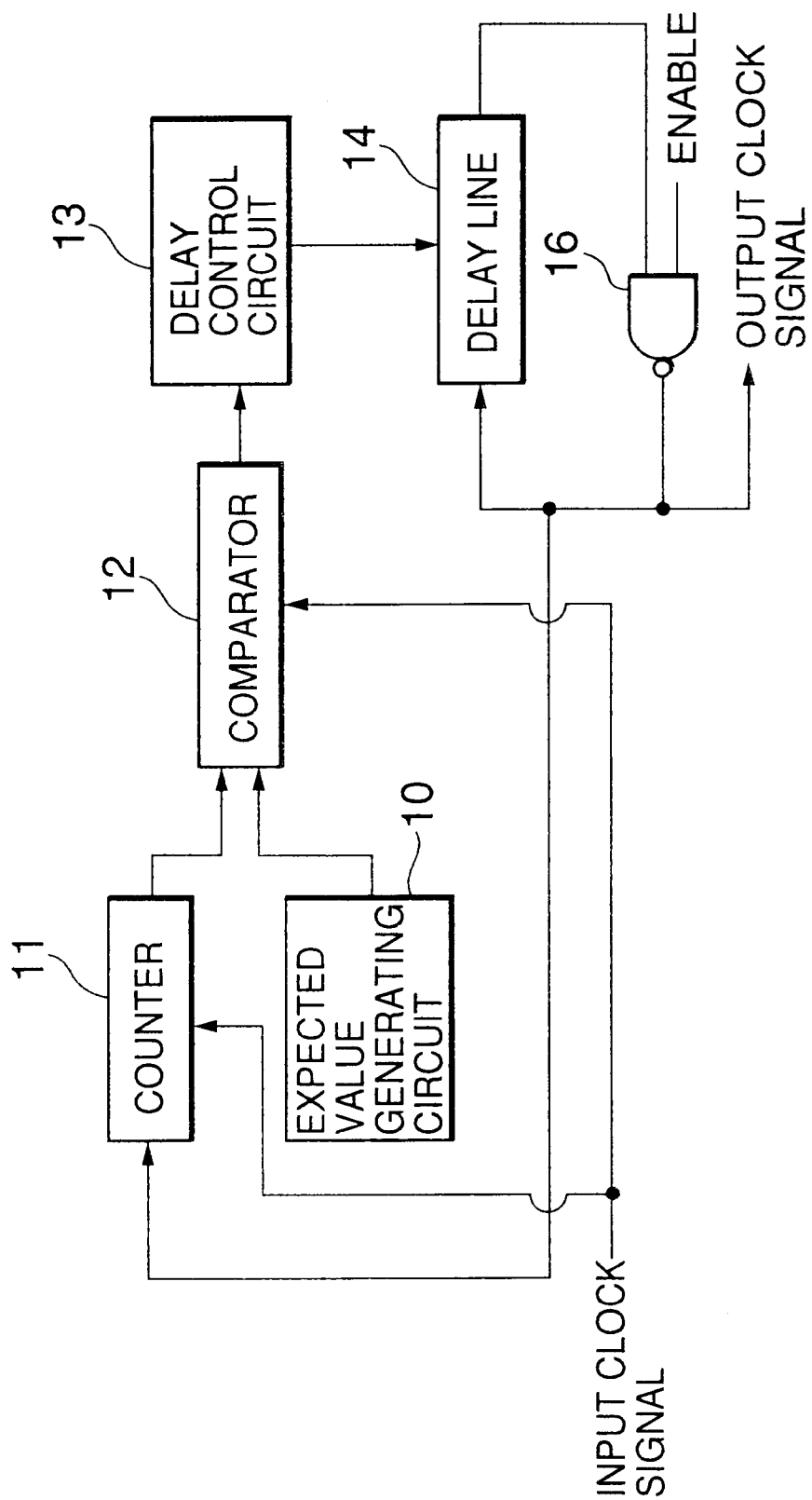
FIG. 6 is a block diagram of a modified example of the first preferred embodiment of a clock multiplier circuit according to the present invention.

FIG. 6 is a block diagram of a modified example of the first preferred embodiment of a clock multiplier circuit according to he present invention. This modified example is the same as the first preferred embodiment, except that a two-input NAND logic circuit 16 is substituted for the inverter 15 forming the ring oscillator in the first preferred embodiment. The output of a delay line 14 is inputted to one input of the two-input NAND logic circuit 16, and the output of the two-input NAND logic circuit 16 is inputted to the delay line 14 to form a ring oscillator. An enable signal is inputted to the other input of the two-input NAND logic circuit 16. When this clock multiplier circuit is used, an enable signal "1" is inputted, and when it is not used, an enable signal "0" is inputted, so that a high frequency output clock signal can be generated only if necessary.

While the enable signal "0" is inputted to stop the ring oscillator, the whole system may be operated by a low frequency (32 KHz) clock which is an input clock to the multiplier circuit. Therefore, when the enable signal "0" is inputted, it is possible to reduce electric power consumption to 1/multiplication factor (about 1/1000). In addition, the address of the delay control signal is held before and after the ring oscillator is stopped, so that the period of the ring oscillator does not change. For that reason, the starting time of the multiplier circuit after stopping is very short, so that the high frequency clock can be frequently stopped.

Figure 7:
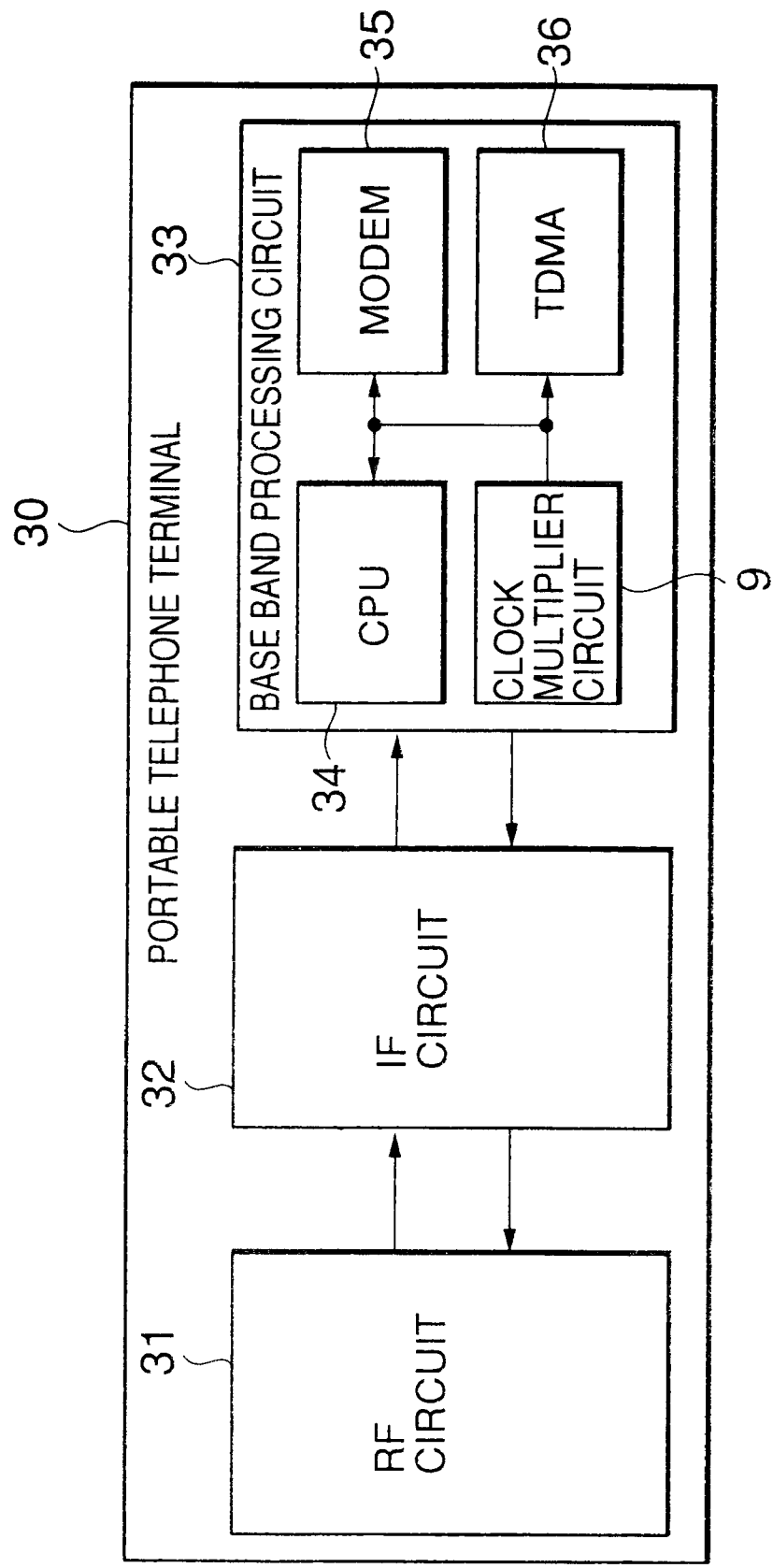
FIG. 7 is a block diagram of a portable telephone.

For example, in the case of a portable telephone system as shown in FIG. 7, the clock can be operated for 20 ms of a frame period of 720 ms during waiting receiving, and the high frequency clock can be stopped for the remaining 720 ms, so that it is possible to greatly increase the waiting time. Thus, if the present invention is applied to a potable telephone driven by a battery.

In FIG. 7 showing a typical portable telephone system, a portable telephone set 30 comprises a radio frequency (RF) circuit 31 for transmitting and receiving radio frequency signals, an intermediate frequency (IF) circuit 32 for processing a frequency conversion between the radio frequency and intermediate frequency, and a base band processing circuit 33. The base band processing circuit 33 comprises a central processing unit (CPU) 34, a modem for modulating and demodulating a voice signal, and a TDMA 36 for controlling transmission and reception signals according to a time divisional multiple access (TDMA). Furthermore, the clock multiplier circuit 9 according to the present invention is assembled in the base band processing circuit 33 in order to generate the desired clocks with low electric power consumption.

Figure 8:
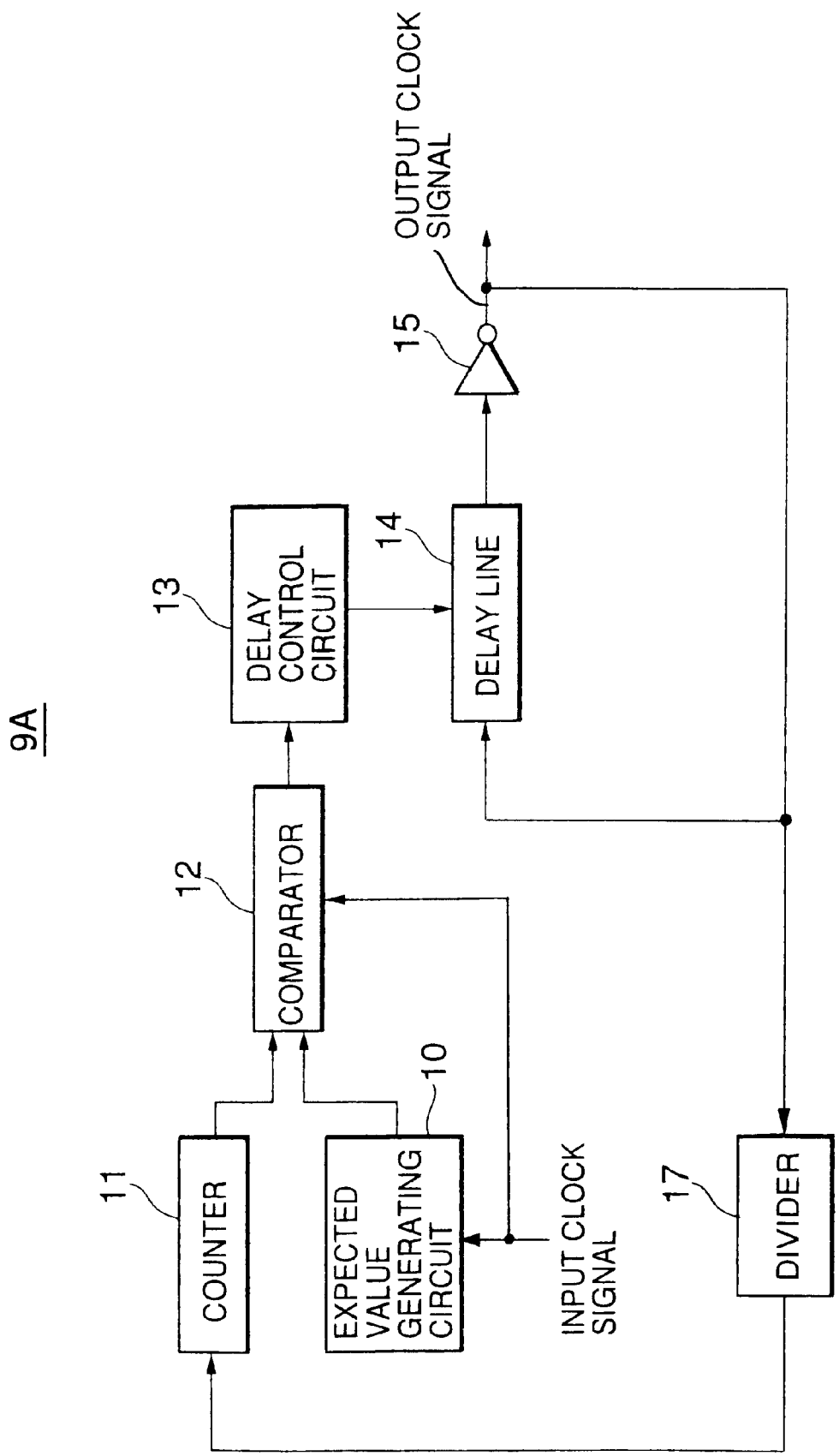
FIG. 8 is a block diagram of another modified example of the first preferred embodiment of a clock multiplier circuit according to the present invention.
Figure 9:
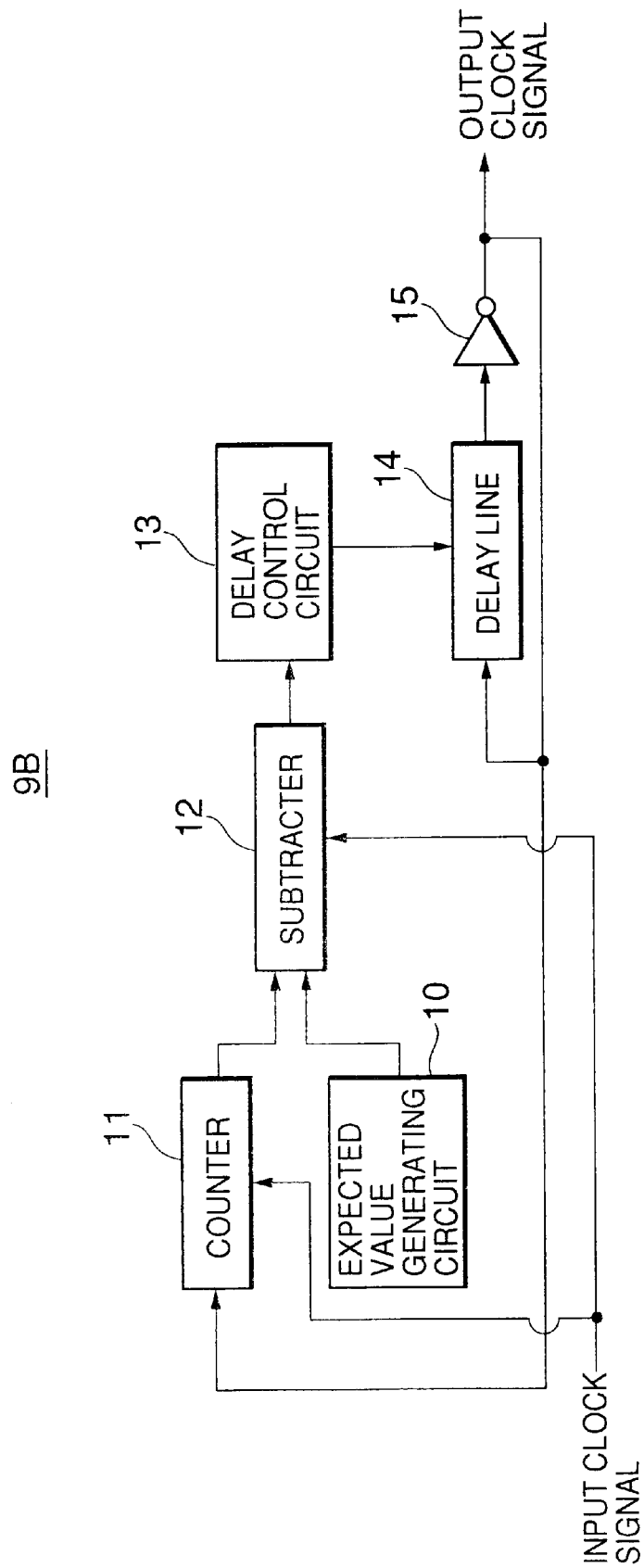
FIG. 9 is a block diagram of the second preferred embodiment of a clock multiplier circuit according to the present invention.

FIG. 8 is a block diagram of another modified example of the first preferred embodiment of a clock multiplier circuit 9A according to the present invention. This modified example is the same as the first preferred embodiment shown in FIG. 2, except that a divider 17 is added downstream of the output clock in the first preferred embodiment, the output of the divider being counted by the divider 17. If the divider 17 is added the frequency counted by the counter 11 can be reduced to 1/N. In this case, it is required to set the expected value to be 1/N of that in the first preferred embodiment shown in FIG. 2.

FIG. by is a block diagram of the second preferred embodiment of a clock multiplier circuit 9B according to the present invention. In the second preferred embodiment, the clock multiplier circuit is the same as that in the first preferred embodiment, except that a subtracter 18 is substituted for the comparator 12 of the clock multiplier circuit by in the first preferred embodiment shown in FIG. 2.

In the second preferred embodiment of a clock multiplier circuit 9B according to the present invention, the MSB (Most Significant Bit) of the subtracted output of the subtracter 18 is a sign bit. If the MSB is "1", the expected value is greater than the counted value, and if the MSB is "0", the expected value is less than the counted value. If all of the subtracted outputs are "0", the expected value is equal to the counted value. Therefore, when the MSB of the subtracted output is "1", a DOWN signal is outputted. When the MSB of the subtracted output is "0" and when any one of other bits of the subtracted output is not "0", and UP signal is outputted. When all of bits of the subtracted output are "0", neither the DOWN signal nor the UP signal is outputted. When the UP signal or the DOWN signal is outputted from the subtracter 17, the updated amount of the delayed value is changed in accordance with the magnitude of the subtracted result (frequency error), so that the lock-in time can be reduced.

For example, as shown in FIG. 10, it is assumed that the delay line 14 is designed so that the counted value of the number of pulses of the output clock signal fluctuates by 1/2 counts for update by one address with respect of the load capacity of the delay line 14 and that an updated address for updating the delayed value is set in accordance with the count error. An example of control for converging the count error in this case is shown in FIG. 11.

As shown in FIG. 11, if the count error in the first comparison is 100, the first preferred embodiment of a clock multiplier circuit according to the present invention shown in FIG. 2 needs 100 comparing operations, whereas in the second preferred embodiment of a clock multiplier circuit according to the present invention shown in FIG. by, the control of FIG. 10 is carried out to converge the count error as shown in FIG. 11, so that the clock multiplier circuit can be locked when 20 comparing operations are carried out. If comparison is carried out using an input clock signal of 32 KHz, the lock-in time is (1/32K)×20=625 μs. On the other hand, in the case of the conventional PLL circuit, the lock-in time is 1000×(1/32K)×100=3.125 s, so that the lock-in time can be greatly reduced.

Figure 12:
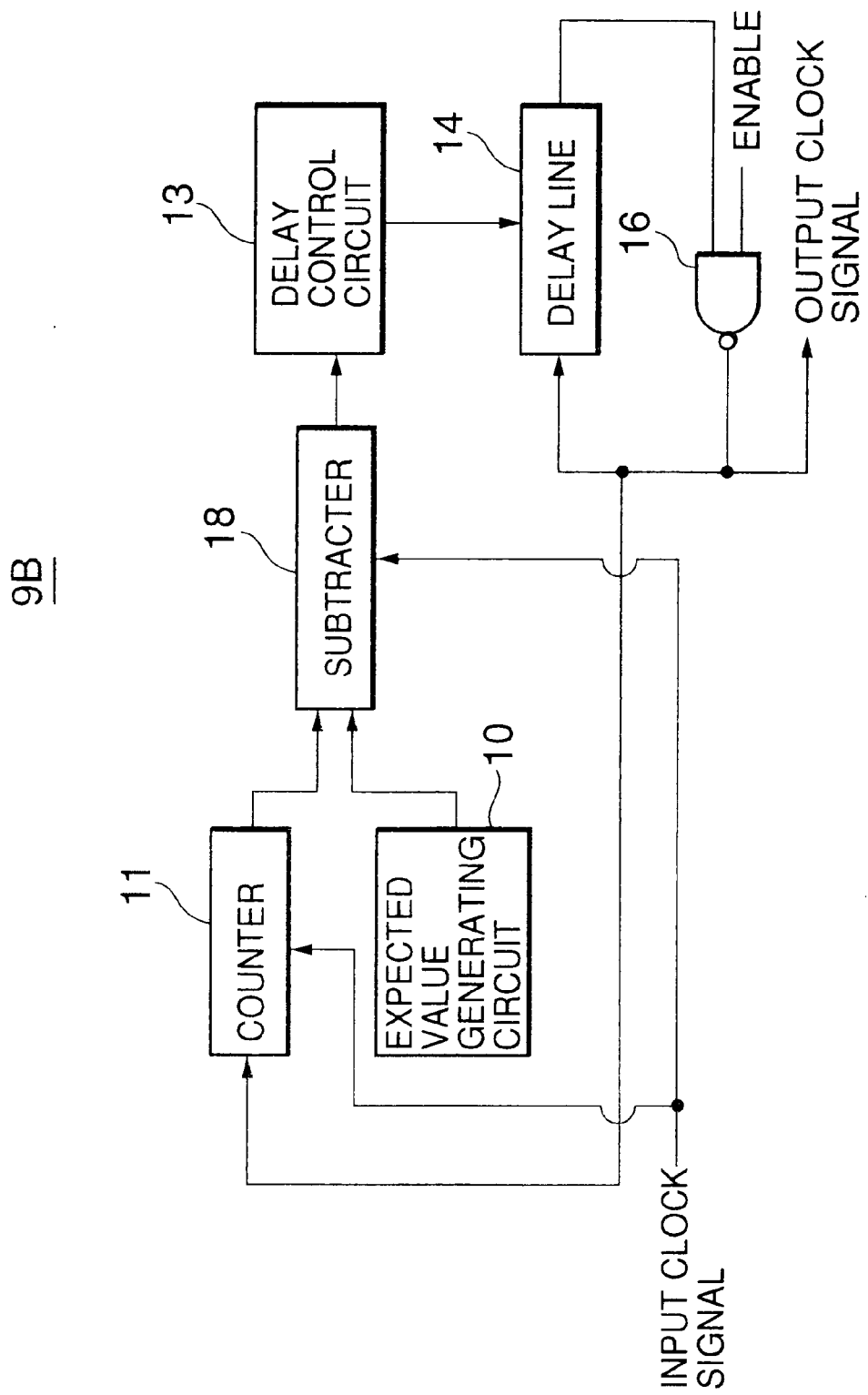
FIG. 12 is a block diagram of a modified example of the second preferred embodiment of a clock multiplier circuit according to the present invention.

FIG. 12 is a block diagram of a modified example of the second preferred embodiment of a clock multiplier circuit according to the present invention. This modified example is the same as the second preferred embodiment, except that a two-input NAND logic circuit 16 is substituted for the inverter 15 forming the ring oscillator in the second preferred embodiment. The output of a delay line 14 is inputted to one input of the two-input NAND logic circuit 16, and the output of the two-input NAND logic circuit 16 is inputted to the delay line 14 to form a ring oscillator. An enable signal is inputted to the other input of the two-input NAND logic circuit 16. When this clock multiplier circuit is used, an enable signal "1" is inputted, and when it is not used, an enable signal "0" is inputted, so that a high frequency output clock signal can be generated only if necessary.

Figure 13:
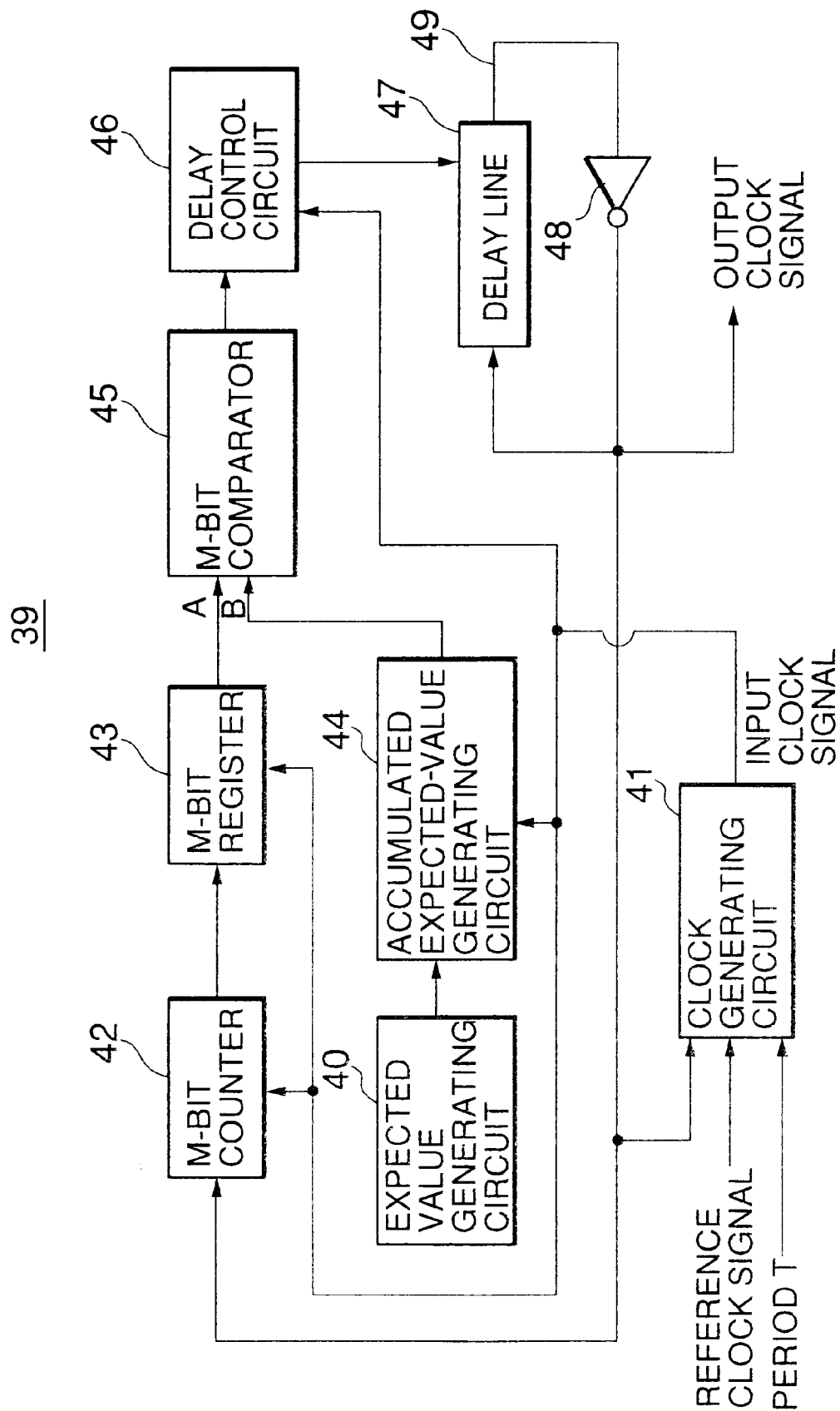
FIG. 13 is a block diagram of the third preferred embodiment of a clock multiplier circuit according to the present invention.

FIG. 13 is a block diagram of the third preferred embodiment of a clock multiplier circuit 39 according to the present invention. In the third preferred embodiment, the clock multiplier circuit 39 comprises: a clock generating circuit 41 for generating an input clock signal to inputted to each of blocks; an M-bit counter 42 for counting the number of pulses of an output clock signal of a ring oscillator; an M-bit register 43 for receiving a counted value of the M-bit counter 42 every one period of the input clock signal; an expected value generating circuit 40 for generating an expected value of the number of pulses of the output clock signal per one period of the input clock signal; an accumulated expected value generating circuit 44 for adding an input expected value, which is inputted from the expected value generating circuit 40, to an output expected value, which is outputted in the last frequency comparison, every one period of the input clock signal and for outputting the resulting expected value; an M-bit comparator 45 for comparing an accumulated counted value outputted from the M-bit register, with an output expected value of the accumulated expected value generating circuit; a delay control circuit 46 for controlling a delayed value of the ring oscillator in accordance with information from the M-bit comparator 45; and the ring oscillator comprising a delay line 47 and an inverter 48 which are capable of changing the delayed value in response to a control signal of the delay control circuit 46.

The M-bit counter 42 counts the number of pulses of the output clock signal in one period of the input clock signal. The M-bit register 43 receives and outputs the counted value of the M-bit counter 42 every one period of the input clock.

In the third preferred embodiment, the clock multiplier circuit is different from the clock multiplier circuit in the first preferred embodiment shown in FIG. 2, at the point that the counted value of the M-bit counter 42 is to reset during a period T which is sufficiently longer than one period of the input clock signal. In the first preferred embodiment, the counter 11 is reset every one period of the input clock signal, whereas in the third preferred embodiment, the M-bit counter 42 is reset every the period T which is sufficiently longer than one period of the input clock signal. Furthermore, the sufficiently long period T, in which the M-bit counter 42 is reset, is controlled by means of a reset period control signal (period T) inputted to the clock generating circuit 41.

Therefore, until the M-bit counter 42 is reset, an ideal expected value for the counted value varies so as to be twice as large as an expected value in one period when the second frequency comparison is carried out, three times as large as the expected value in one period when the third frequency comparison is carried out, and L times as large as the expected value in one period when the number L frequency comparison is carried out. Therefore, there is provided the accumulated expected value generating circuit 44 for accumulating the expected values generated by the expected value generating circuit.

The expected value generating circuit 40 generates, as an expected value to be inputted to the M-bit comparator 45, a counted value when counting the number of pulses of an ideal output clock signal in one period of an input clock signal. For example, when it is intended to derive an output clock signal having a frequency of 64 MHz from an input clock signal having a frequency of 32 KHz, an expected value of (1/32K)/(1/64M)=2000 is generated as a binary data. When the frequencies of the input clock signal and the output clock signal to be derived are changed, the setting of the frequencies of the input clock signal and the output clock signal to be derived is inputted to calculate and generate the expected value. When the frequencies of the input clock signal and the output clock signal to be derived are always constant, the expected value generating circuit 40 is enough to always generate a constant expected value.

In addition, it is possible to apparently input an expected value including a decimal by changing the expected value every input clock period. For example, although the expected value may be set to 1000.5 in order to obtain an output of 32.016 MHz, the expected value can be set only to an integer, and the expected value can not be set so as to include a decimal.

Figure 14:
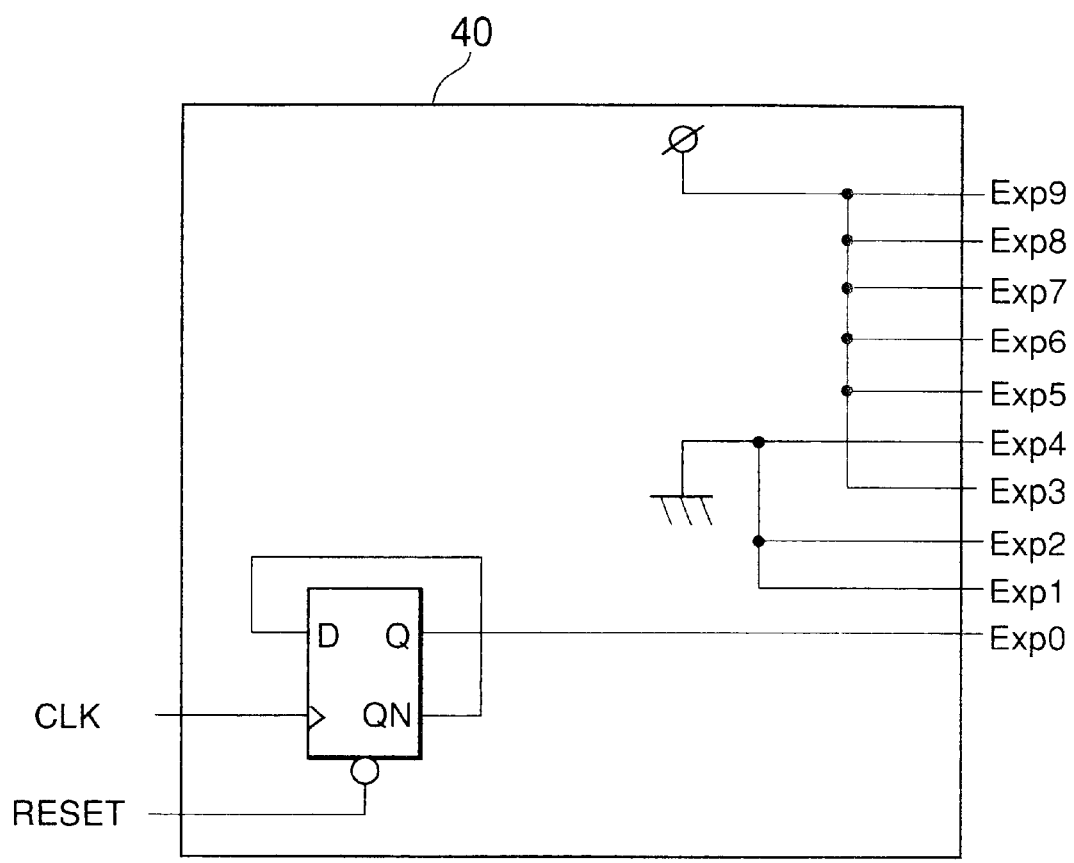
FIG. 14 is a circuit diagram showing an example of a 10-bit expected value generating circuit.

However, if 1000(1111101000) and 1001(1111101001) are alternately set as an expected value, it is possible to apparently set the expected value to be 1000.5 by using the expected value generating circuit 40 having the detailed constitution shown in FIG. 14. This can be achieved if a fixed value is set as the expected value for significant 9 bits, Exp 9:1(111110100), and if the output of a 1/2 divider is set as the expected value only the LSB, Exp 0. An example of such a circuit (a 10-bit expected value generating circuit) is shown in FIG. 14. Thus, a multiplication factor including a decimal a/b (a, b: integer) can be apparently set if 1 is set a times per b times and 0 is set b-a times per b times.

Figure 15:
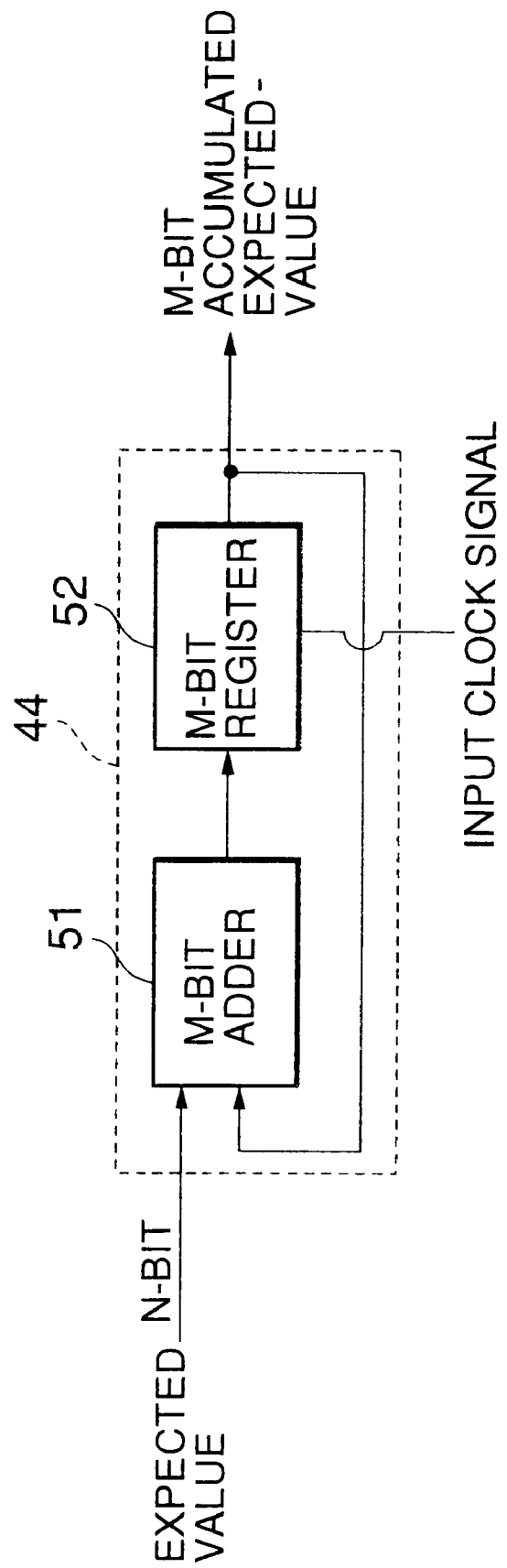
FIG. 15 is a block diagram of an example of an accumulated expected value generating circuit.

FIG. 15 is a block diagram of an example of an accumulated expected value generating circuit. As shown in FIG. 15, the accumulated expected value generating circuit 44 of FIG. 13 is designed so that an M-bit adder 51 and an M-bit register 52 are connected as a cycle, and an output expected value in the last frequency comparison, which is outputted from the M-bit register 52, and an input expected value are inputted to the M-bit adder 51 to be added to each other, to input the resulting accumulated expected value to the M-bit register 52 every one period of the input clock signal.

The bit number M of the M-bit adder 51 and the M-bit register 52 must be set so as not to overflow even if an expected value of N bits is added L times. Furthermore, the expected value generating circuit 40 and the accumulated expected value generating circuit 44 do not need to be provided when the accumulated expected value to be generated by the accumulated expected value generating circuit 44 can be supplied from an external signal.

Figures 16, 17:
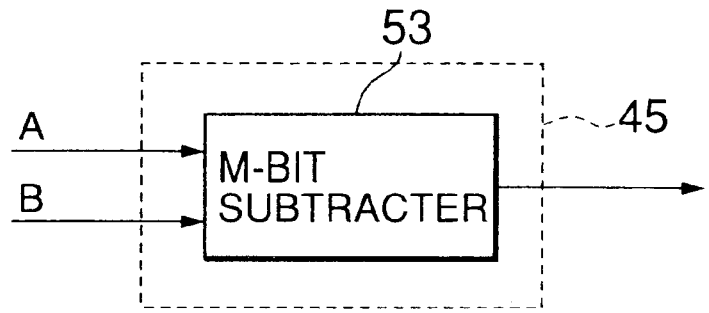
FIG. 16 is a block diagram of an example of an M-bit comparator comprising a subtracter circuit.
FIG. 17 is a table showing the relationship between count errors, updated addresses and count error correction values, in a delay line design.

The M-bit comparator 45 of FIG. 13 compares the counted value of the M-bit register 43 with the output expected value of the accumulated expected value generating circuit every one period of the input clock signal. FIG. 16 is a block diagram of an example of an M-bit comparator comprising a subtracter circuit. As shown in FIG. 16, in this example, an M-bit subtracter 53 is used as the M-bit comparator 45 of FIG. 13, and a counted value A of the M-bit register 43 and an output expected value B of the accumulated expected value generating circuit 44 are inputted to the M-bit subtracter 53.

The MSB of the subtracted output of the M-bit subtracter 53 is a sign bit. If the MSB is "1", the accumulated expected value is greater than the counted value, and if the MSB is "0", the accumulated expected value is less than the counted value. If all of the subtracted outputs are "0", the accumulated expected value is equal to the counted value.

Therefore, when the MSB of the subtracted output is "1", a DOWN signal is outputted. When the MSB of the subtracted output is "0" and when any one of other bits of the subtracted output is not "0", an UP signal is outputted. When all of bits of the subtracted output are "0", neither the DOWN signal nor the UP signal is outputted.

After comparison in the M-bit comparator 45, the delay control circuit of FIG. 13 controls the delayed value of the delay line 47 in accordance with information from the M-bit comparator 45. When the M-bit comparator 45 of FIG. 16, i.e., the M-bit subtracter 53, is sued, it is determined whether the delay address is caused to be UP or DOWN in accordance with the MSB, and whether the delay address is updated is controlled by the absolute value of the error data (the absolute value of the subtracted value, bits other than the MSB). For example, the error data in the last comparison is held, and the absolute value of the last error data is compared with the absolute value of the current error date. When the absolute value of the current error date is less than that of the last error data, the delay address is held, and when the absolute value of the current error data is equal to or greater than that of the last error data, the delay address is updated. The updated amount of the delay address is determined in accordance with the absolute value of the error date. For example, it is determined in a manner shown in FIG. 17 as described below.

The delay line is designed so that the next counted value fluctuates by 1 count by updating a capacity address of the delay address, and an example of control when the count error in the first comparison is 50 is shown in FIG. 18.

The count error is an error caused every comparing operation, and the accumulated count error is an accumulating total of count errors in the respective comparing operations. In FIG. 18, since the accumulated count error increases until the second comparing operation, the output clock signal of the ring oscillator has a higher frequency, so that the phase error increases. Therefore, the delay address is updated in accordance with control of FIG. 17. In the third comparing operation, the accumulated count error decreases, so that the output clock signal of the ring oscillator has a slightly lower frequency. Therefore, since the accumulated count error corresponding to the phase error decreses, the delay address is not updated thereafter. However, since the frequency of the output clock signal of the ring oscillator is slightly low, the address is fixed, so that the accumulated count error corresponding to the phase error is surely decreased until the thirteenth comparing operation. In the fourteenth and fifteenth comparing operations, the absolute value of the accumulated count error is greater than that in the last comparing operation, so that the address is updated in accordance with the control of FIG. 17. Thus, if the absolute value of the accumulated counted value is less than that in the last comparing operation, the delay address is held, and if the accumulated count error is greater than or equal to that in the last comparing operation, the delay address is updated. At this time, if the updated amount is set so that the correction value of the counted number due to update of the delayed value is less than the accumulated count error, it is possible to surely converge the accumulated count error to zero.

Moreover, as an accompanying advantage of the comparison between the accumulated counted value and the accumulated expected value, the output clock frequency is a periodically modulated control algorithm, so that there is an advantage in the EMI can be reduced. The delay line is designed so that the next counted value is changed by 1 by updating the address by 10 (the change of the frequency corresponding to 0.1 counts by updating the address by 1). The output clock exists at the delay address for outputting an ideal frequency which is the input clock multiplied by the multiplication factor. The accumulated count error is 1.5 counts (only 1 count can be detected as a count error, and the phase error corresponding to the remaining 0.5 counts is not detected). If the absolute value of the accumulated count error decreases, the delay address is held, and if the accumulated count error increases or constant, the delay address is updated. When the amount of the update address is controlled in a manner shown in FIG. 17, the results are shown in FIG. 19.

In the first comparison, the accumulated count error is 1 count (the detected error is 1 although the actual error is 1.5) although the current address is the same as an address of an ideal frequency in the first comparison, so that the address is reduced by 1. In the second comparison, since the address is less than the ideal address by 1, the accumulated count error is reduced by 0.1(−1×0.1 (correction value per 1 address)=−0.1), so that the accumulated count error is 1.4 counts. Since the detected accumulated count error is 1 count which is the same as that in the last comparison, the address is decreased by one more. In the third comparison, since the address is less than the ideal address by 2, the accumulated count error decreases by 0.2(−2×0.1=−0.2), so that the accumulated count error is 1.2 counts. Since the detected accumulated count error is 1 count which is the same as that in the last comparison, the address is decreased by one more. In the fourth comparison, the accumulated count error is 0.9 counts, and the detected accumulated count error is 0 count. Since the accumulated count error decreases, the address is not updated. In the fifth through tenth comparisons, although the accumulated count error is the same value which does not decrease, the value is 0, so that the address of the updated. However, since the address is less than the address of the ideal frequency by 3, the accumulated count error decreases by 0.3(−3×0.1=−0.3) every comparison. In the eleventh through sixteenth comparisons, the accumulated error is −1, and the absolute value of the accumulated count error does not decrease from that in the last comparison, so that the address is increased by 1.

Figure 20:
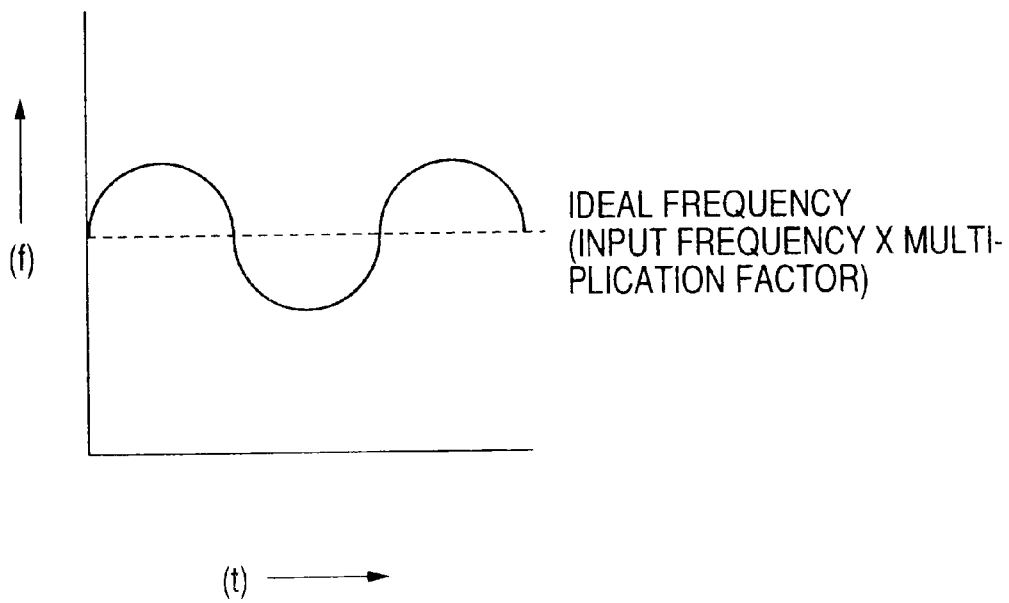
FIG. 20 is a graph showing the state of output frequencies when the address is controlled as shown in FIG. 19.

The same control is repeated, and the delay address continues to fluctuate, so that it never continue to stay a certain address. Because the correction value of the address is less than the detectable minimum accumulated count error. FIG. 20 shows the state of output frequencies when the address is controlled as shown in FIG. 19. In FIG. 20, the ordinate denotes time (t), and the abscissa denotes frequencies (f). FIG. 20 shows the state that the clock frequency is operated as if it is modulated around the ideal frequency calculated by multiplying the input clock frequency by the multiplication factor. As shown in FIG. 20, since the modulation of the clock corresponds to the increase of jitters, it is required to suppress the frequency fluctuation to a range in which the system using this clock has a sufficient frequency margin.

Figure 21:
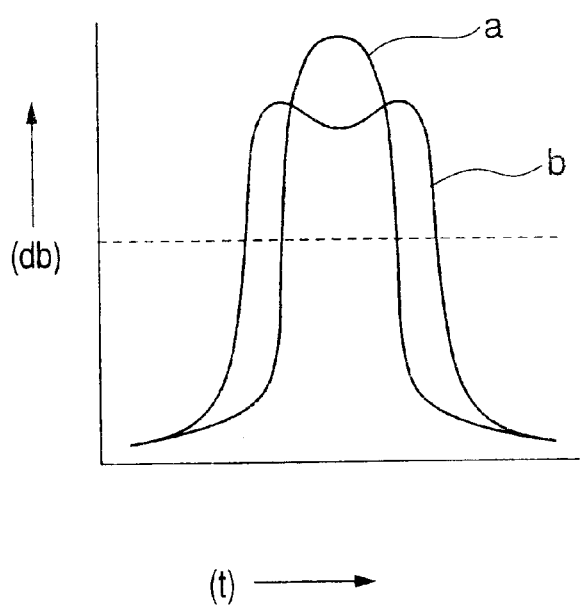
FIG. 21 is a graph showing typical characteristics of clocks which are outputted in accordance with the control shown in FIG. 19 and which observed by a spectrum analyzer.

A waveform a shown in FIG. 21 is typical characteristics of clocks which are outputted din accordance with the control shown in FIG. 19 and which observed by a spectrum analyzer. In FIG. 21, a waveform a denotes an output clock from a crystal oscillator circuit having no jitter. The abscissa denotes frequencies, and the ordinate denotes magnitude (db). It can be seen that in a waveform b showing the characteristic of the clock multiplier circuit according to the present invention, the spectrum is dispersed and the magnitude thereof is small to reduce the EMI, in comparison with the output of the waveform a of the crystal oscillator.

Therefore, if the correction value is less than the detectable minimum accumulated count error, the output frequency fluctuates periodically, so that the spectrum is dispersed in a wide frequency band, and the magnitude thereof decreases, thereby decreasing the EMI.

As described above, in the third preferred embodiment of a clock multiplier circuit according to the present invention, the counted continues to count up without being reset every one period of the input clock signal. The expected value for the counted value is accumulated to be an accumulated expected value which is twice as large as the expected value in one period of the input clock signal when the second frequency comparison is carried out, three times as large as the expected value in one period of the input clock signal when the third frequency comparison is carried out, and L times as large as the expected value in one period of the input clock signal when the number L frequency comparison is carried out. Then, the counted value is compared with the accumulated expected value every one period of the input clock signal. Therefore, although the frequency error per one frequency comparing operation is constant, the frequency error can be very small in a period T which is sufficiently longer than one period of the input clock signal. As a result, a high frequency output clock signal, which is stable and which has small jitters, can be generated at high speed.

Figure 22:
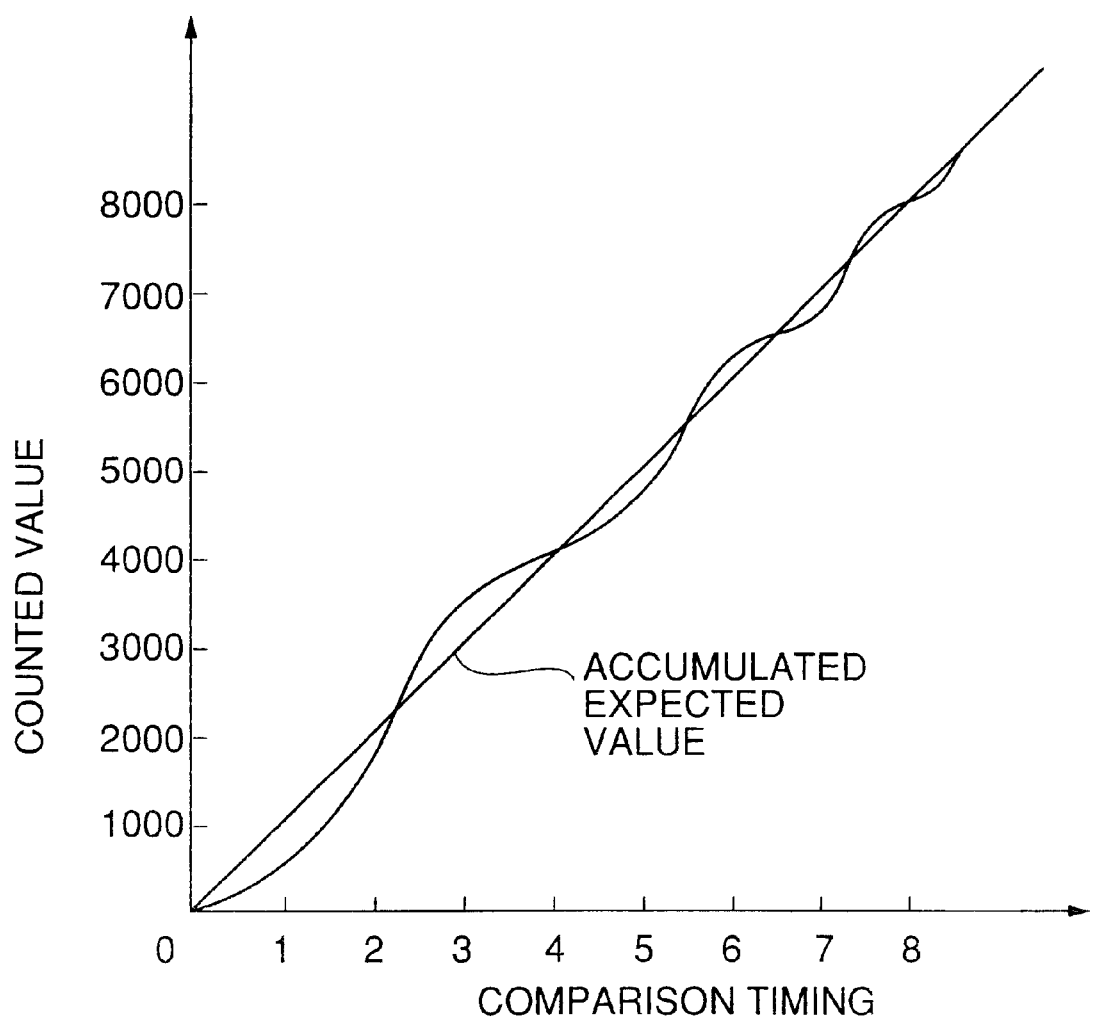
FIG. 22 is a graph showing the relationship between the variation in accumulated counted value and accumulated expected values, until the third preferred embodiment of a clock multiplier circuit according to the present invention is locked.

FIG. 22 is a graph showing the relationship between the variation in accumulated counted value and accumulated expected values, until the third preferred embodiment of a clock multiplier circuit according to the present invention is locked. Furthermore, the numerical values are not coincident with those in the examples shown in FIGS. 17 and 18.

As shown in FIG. 22, in the third preferred embodiment of a clock multiplier circuit according to the present invention, the counted value of the number of pulses of the output clock signal varies as a decay curve about the accumulated expected value, and converges so as to be finally coincident with the accumulated expected value to be locked.

Figure 23:
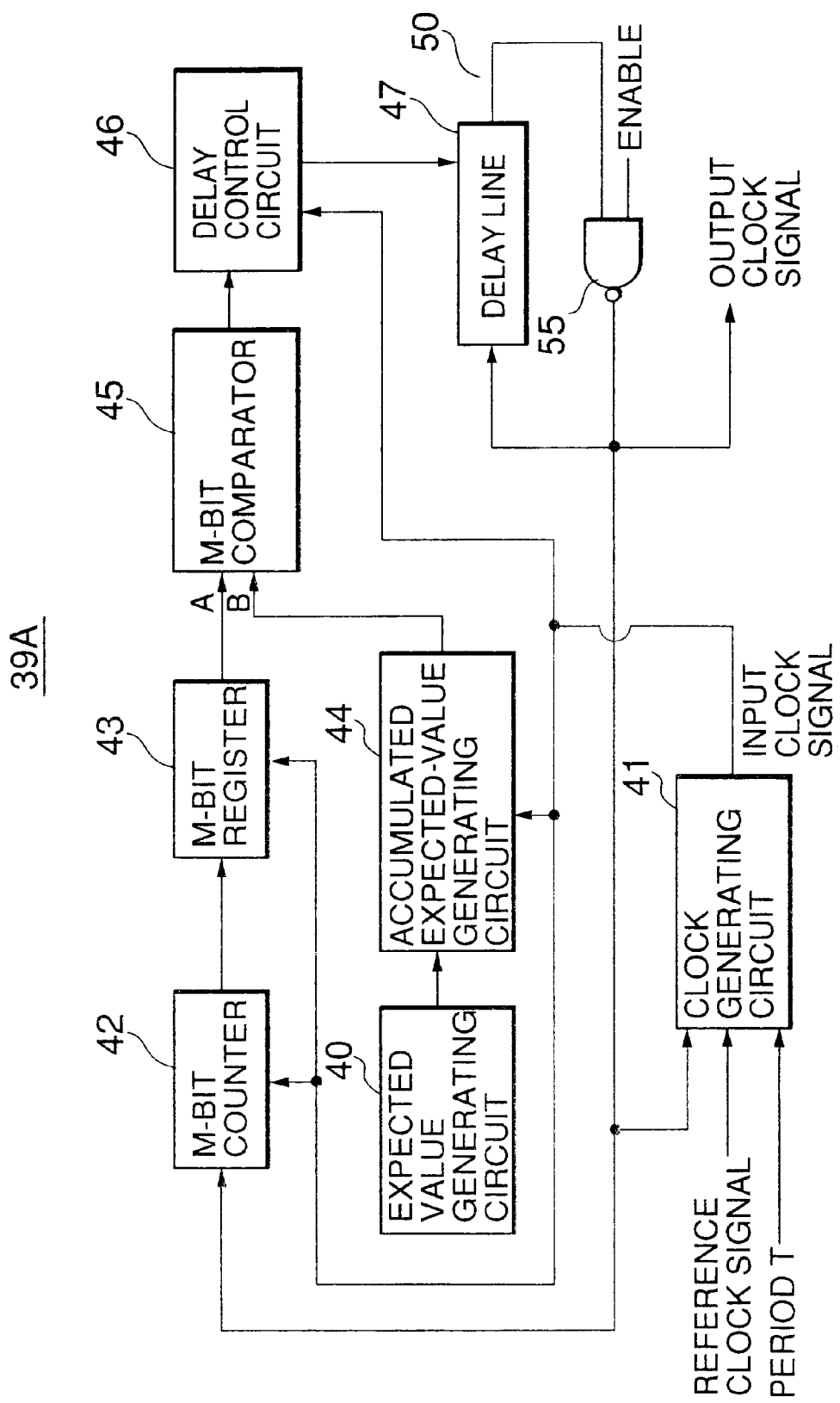
FIG. 23 is a block diagram of a modified example of the third preferred embodiment of a clock multiplier circuit according to the present invention.

FIG. 23 is a block diagram of a modified example of the third preferred embodiment of a clock multiplier circuit 39 according to the present invention. This modified example is the same as the third preferred embodiment, except that a two-input NAND logic circuit 55 of a ring oscillator 50 is substituted for the inverter 48 forming the ring oscillator 49 in the third preferred embodiment. The output of a delay line 47 is inputted to one input of the two-input NAND logic circuit 55, and the output of the two-input NAND logic circuit 55 is inputted to the delay line 47 to form a ring oscillator 50. An enable signal is inputted to the other input of the two-input NAND logic circuit 55. When this clock multiplier circuit is used, an enable signal "1" is inputted, and when it is not used, an enable signal "0" is inputted, so that a high frequency output clock signal can be generated only if necessary.

According to a first aspect of the present invention, a clock multiplier circuit comprises: a counter for counting the number of pulses of a predetermined output clock signal; an expected value generating circuit for generating an expected value for the number of pulses of the predetermined output clock signal per a first period which is sufficiently longer than one period of the predetermined output clock signal; a comparator circuit for comparing the counted value of the counter with the expected value per the first period to output a comparative information on the comparative result; a delay control circuit for generating a delay control signal indicative of change of the frequency of the predetermined output signal in accordance with the comparative information; and an output clock signal generating circuit for generating the predetermined output clock signal while changing the frequency in accordance with the delay control signal. Thus, the counted value is compared with the expected value, and the period for comparison between the counted value and the expected value is far shorter than the period for the frequency comparison in the conventional PLL circuit, so that the lock-in time can be considerably shortened. As a result, a high frequency output clock signal, which is stable and which has small jitters, can be generated at high speed. In addition, since the clock multiplier circuit is a digital circuit, the circuit can be easily formed even at a low voltage, and the circuit can stably operate even if the frequency of the input clock signal is allow frequency of about 32 KHz, so that it is possible to reduce electric power consumption.

According to a second aspect of the present invention, a clock multiplier circuit comprises: a counter or counting the number of pulses of a predetermined output clock signal; a register for receiving and outputting a counted value of the counter every a first period which is sufficiently longer than one period of the predetermined output clock signal; an expected value generating circuit for generating an expected value for the number of pulses of the predetermined output cock signal per the first period; an accumulated expected value generating circuit for outputting an accumulated expected value, which is obtained by accumulating the expected value, per the first period; a comparator circuit for comparing the counted value outputted from the register with the accumulated expected value to output a comparative information on the comparative result; a delay control circuit for generating a delay control signal indicative of change of the frequency of the predetermined output signal in accordance with the comparative information; and an output clock signal generating circuit for generating the predetermined output clock signal while changing the frequency in accordance with the delay control signal. The counter continues to count up without being reset every one period for comparison in the comparator. The expected value for the counted value is accumulated to be an accumulated expected value which is twice as large as the expected value in one period for comparison when the second frequency comparison is carried out, three times as large as the expected value in one period for comparison when the third frequency comparison is carried out, and L times as large as the expected value in one period for comparison when the number L frequency comparison is carried out. Then, the counted value is compared with the accumulated expected value. Therefore, a minute frequency error, which is not corrected as a count error per one comparison, can be accumulated to be corrected as a count error. Thus, the frequency error can be very small in a period T which is sufficiently longer than one period of the input lcokc singal. As a result, a high frequency output clock signal, which is stable and which has small jitters, can be generated at high speed.

Moreover, as an accompanying advantage of the comparison between the accumulated counted value and the accumulated expected value, the output clock frequency is a periodically modulated control algorithm, so that there is an advantage in the EMI can be reduced.

Therefore, for example, a synchronous clock for a portable telephone is difficult to synchronize unless a frequency error per 720 ms is equal to or less than 10 ppm, so that this synchronism can not be realized by the conventional clock multiplier circuit. By using a clock multiplier circuit according to the present invention, it is possible to realize the synchronism even if the allowable limit of the frequency error is very small. Thus, it is not required to provide a high frequency oscillator, through which a large current flows, so that it is possible to reduce electric power consumption.

Moreover, if the ring oscillator is stopped when the clock is not required and if the ring oscillator is operated only when the clock is required, it is possible to reduce electric power consumption. For example, in the case of a potable telephone, the clock can be operated for 20 ms of a frame period of 720 ms during waiting receiving, and the high frequency clock can be stopped for the remaining 700 ms, so that it is possible to greatly increase the waiting time. Thus, if the present invention is applied to a potable telephone driven by a battery.

What is claimed is:

1. A clock multiplier circuit for generating a high frequency clock signal having small jitters from a low frequency input clock, said clock multiplier circuit comprising:
    a counter for counting the number of pulses of a predetermined output clock signal;
    an expected value generating circuit for generating an expected value for the number of pulses of said predetermined output clock signal per a first period which is longer than one period of said predetermined output clock signal;
    a comparator circuit for comparing a counted value of said counter with said expected value per said first period to output a comparative information on the comparative result;
    a delay control circuit for generating a delay control signal indicative of change of a frequency of said predetermine output clock signal in accordance with said comparative information; and
    an output clock signal generating circuit operative in digital from and at least including a delay element for generating said predetermined output clock signal through an output node thereof by changing the frequency in accordance with said delay control signal, and an output-stopping logic element for stopping a generation of said predetermined output clock signal and having two inputs and one output, one input of which is connected to said output node of said delay element and the other input of which receives an enable signal, and the output of which is connected to an input node of said delay element.

2. A clock multiplier circuit as set forth in claim 1, wherein said output clock signal generating circuit further comprises:
    a plurality of stages of delay generating circuits as said delay element, the number of stages of the delay generating circuits to be connected in series as a signal propagating path being selectively changed in accordance with said delay control signal; and
    a ring oscillator comprising a delay line including said delay element and a plurality of load capacities, the number of the load capacities added upstream of said plurality of stages of delay generating circuits being selectively changed in accordance with said delay control signal, and a NAND circuit as said output-stopping logic element, one input of which is connected to an output node of said delay line and the other input of which receives said enable signal, the output node of which is connected to an input node of said delay line.

3. A clock multiplier circuit as set forth in claim 1, wherein said output clock signal generating circuit further comprises:
    a plurality of stages of delay generating circuits as said delay element, the number of stages of the delay generating circuits to be connected in series as a signal propagating path being selectively changed in accordance with said delay control signal; and
    a ring oscillator comprising a delay line including said delay element and a plurality of load capacities, the number of the load capacities added upstream of said plurality of stages of delay generating circuits being selectively changed in accordance with said delay control signal, and an inverter connected between an output node and an input node of said delay line.

4. A clock multiplier circuit as set forth in claim 1, further comprising a device configured to reset said counter per said first period.

5. A clock multiplier circuit as set forth in claim 4, wherein said output clock signal generating circuit further comprises;
    a plurality of stages of delay generating circuits as said delay element, the number of stages of the delay generating circuits to be connected in series as a signal propagating path being selectively changed in accordance with said delay control signal; and
    a ring oscillator comprising a delay line including said delay element and a plurality of load capacities, the number of the load capacities added upstream of said plurality of stages of delay generating circuits being selectively changed in accordance with said delay control signal, and an inverter connected between an output node and an input node of said delay line.

6. A clock multiplier circuit as set forth in claim 4, wherein said output clock signal generating circuit further comprises:
    a plurality of stages of delay generating circuits as said delay element, the number of stages of the delay generating circuits to be connected in series as a signal propagating path being selectively changed in accordance with said delay control signal; and
    a ring oscillator comprising a delay line including said delay element and a plurality of load capacities, the number of the load capacities added upstream of said plurality of stages of delay generating circuits being selectively changed in accordance with said delay control signal, and a NAND circuit, one input of which is connected to an output node of said delay line and the other input of which receives an enable signal, the output node of said NAND circuit being connected to an input node of said delay line.

7. A clock multiplier circuit for generating a high frequency clock signal having small jitters from a low frequency input clock, said clock multiplier circuit comprising:
    a counter for counting the number of pulses of a predetermine output clock signal;
    a register for receiving and outputting a counted value of said counter every first period which is longer than one period of said predetermine output clock signal;
    an expected value generating circuit for generating an expected value for the number of pulses of said predetermine output clock signal per said first period;
    an accumulated expected value generating circuit for outputting an accumulated expected value, which is obtained by accumulating said expected value, per said first period;

a comparator circuit for comparing said counted value outputted from said register with said accumulated expected value to output a comparative information on the comparative result;

a delay control circuit for generating a delay control signal indicative of change of a frequency of said predetermine output clock signal in accordance with said comparative information; and an output clock signal generating circuit operative in digital from and at least including a delay element for generating said predetermined output clock signal through an output node thereof by changing the frequency in accordance with said delay control signal, and an output-stopping logic element for stopping a generation of said predetermined output clock signal and having two inputs and one output, one input of which is connected to said output node of said delay element and the other input of which receives an enable signal, and the output of which is connected to an input node of said delay element.

8. A clock multiplier circuit as set forth in claim 7, wherein said output clock signal generating circuit further comprises:

a plurality of stages of delay generating circuits as said delay element, the number of stages of the delay generating circuits to be connected in series as a signal propagating path being selectively changed in accordance with said delay control signal; and a ring oscillator comprising a delay line including said delay element and a plurality of load capacities, the number of the load capacities added upstream of said plurality of stages of delay generating circuits being selectively changed in accordance with said delay control signal, and an inverter connected between an output node and an input node of said delay line.

9. A clock multiplier circuit as set forth in claim 7, wherein said output clock signal generating circuit further comprises:

a plurality of stages of delay generating circuits as said delay element, the number of stages of the delay generating circuits to be connected in series as a signal propagating path being selectively changed in accordance with said delay control signal; and a ring oscillator comprising a delay line including said delay element and a plurality of load capacities, the number of the load capacities added upstream of said plurality of sages of delay generating circuits being selectively changed in accordance with said delay control signal, and a NAND circuit as said output-stopping logic element, one input of which is connected to an output node of said delay line and the other input of which receives said enable signal, the output node of which is connected to an input node of said delay line.

10. A clock multiplier circuit as set forth in claim 7, further comprising a device configured to reset said counter, said register and said accumulated expected value generating circuit per a second period which is longer than said first period.

11. A clock multiplier circuit as set forth in claim 10, wherein said output clock signal generating circuit further comprises:

a plurality of stages of delay generating circuits as said delay element, the number of stages of the delay generating circuits to be connected in series as a signal propagating path being selectively changed in accordance with said delay control signal; and a ring oscillator comprising a delay line including said delay element and a plurality of load capacities, the number of the load capacities added upstream of said plurality of stages of delay generating circuits being selectively changed in accordance with said delay control signal, and an inverter connected between an output node and an input node of said delay line.

12. A clock multiplier circuit as set forth in claim 10, wherein said output clock signal generating circuit further comprises:

a plurality of stages of delay generating circuits as said delay element, the number of stages of the delay generating circuits to be connected in series as a signal propagating path being selectively changed in accordance with said delay control signal; and a ring oscillator comprising a delay line including said delay element and a plurality of load capacities, the number of the load capacities added upstream of said plurality of stages of delay generating circuits being selectively changed in accordance with said delay control signal, and a NAND circuit as said output-stopping logic element, one input of which is connected to an output node of said delay line and the other input of which receives said enable signal, the output node of which is connected to an input node of said delay line.

13. A clock multiplier circuit as set forth in any one of claims 1 through 12, which further comprises means for inputting data in place of said expected value generating circuit.

14. A clock multiplier circuit for generating a high frequency clock signal having small jitters from a low frequency input clock, said clock multiplier circuit comprising:

a divider for dividing a predetermined output clock signal;

a counter for counting a number of pulses in said divider;

an expected value generating circuit for generating an expected value for the number of pulses of said predetermined output clock signal per a first period which is longer than one period of said predetermine output clock signal;

a comparator circuit for comparing a counted value of said counter with said expected value per said first period to output a comparative information on the comparative result;

a delay control circuit for generating a delay control signal indicative of change of a frequency of said predetermined output clock signal in accordance with said comparative information; and an output signal generating circuit for generating said predetermined output clock signal by changing the frequency in accordance with said delay control signal.

* * * * *